(12) United States Patent
Suzuki

(10) Patent No.: US 6,667,202 B2
(45) Date of Patent: Dec. 23, 2003

(54) SEMICONDUCTOR DEVICE AND METHOD FOR MAKING THE SAME

(75) Inventor: Hisamitsu Suzuki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 19 days.

(21) Appl. No.: 09/852,778

(22) Filed: May 11, 2001

(65) Prior Publication Data

US 2002/0011648 A1 Jan. 31, 2002

Related U.S. Application Data

(62) Division of application No. 09/105,458, filed on Jun. 26, 1998.

(30) Foreign Application Priority Data

Jun. 27, 1997 (JP) ............................................. 9-171657

(51) Int. Cl.[7] ................ H01L 21/8238; H01L 21/8234; H01L 31/119
(52) U.S. Cl. ...................... 438/202; 438/203; 438/204; 438/205; 438/234; 438/236; 438/322; 257/370; 257/371; 257/372
(58) Field of Search ................................. 438/202, 203, 438/204, 205, 234, 236, 322; 257/370, 371, 372

(56) References Cited

U.S. PATENT DOCUMENTS

| 5,358,882 A | 10/1994 | Bertagnolli et al. |
| 5,358,884 A | 10/1994 | Violette |
| 5,451,538 A | 9/1995 | Fitch et al. |
| 5,547,893 A | 8/1996 | Sung |
| 5,841,197 A | 11/1998 | Adamic, Jr. |
| 5,970,333 A | 10/1999 | Gris et al. |

FOREIGN PATENT DOCUMENTS

| JP | 64-15974 | 1/1989 |
| JP | 64-76756 | 3/1989 |
| JP | 2-187065 | 7/1990 |
| JP | 4-142076 | 5/1992 |

OTHER PUBLICATIONS

H. Suzuki, et al., "Process Integration Technologies for a 0.3 m BiCMOS SRAM with 1.5V Operation," IEEE, Proceedings of the 1996 Bipolar/BiCMOS Circuits and Technology Meeting, pp. 89–92.

K. Ishimaru, et al., "Bipolar Installed CMOS Technology Without Any Process Step Increase for High Speed Cache SRAM," Technical Digest of International Electron Devices Meeting 1995, pp. 673–676.

*Primary Examiner*—Wael Fahmy
*Assistant Examiner*—Shrinivas H Rao
(74) *Attorney, Agent, or Firm*—Sughrue Mion, PLLC

(57) ABSTRACT

A semiconductor device which has: a bipolar transistor having a collector region of a second conductivity type formed from the surface of a semiconductor substrate of a first conductivity type, a base region of a first conductivity type formed from the surface of the collector region, and an emitter region of a second conductivity type formed from the surface of the base region; a collector extraction region that is separated by an insulating layer and is formed in the collector region except the base region; a concave portion in the collector extraction region that is formed up to a depth where the collector region has a peak concentration in impurity distribution; and a collector extraction electrode that is connected with the collector region to extract ohmic-connecting to the bottom of the concave portion.

8 Claims, 21 Drawing Sheets

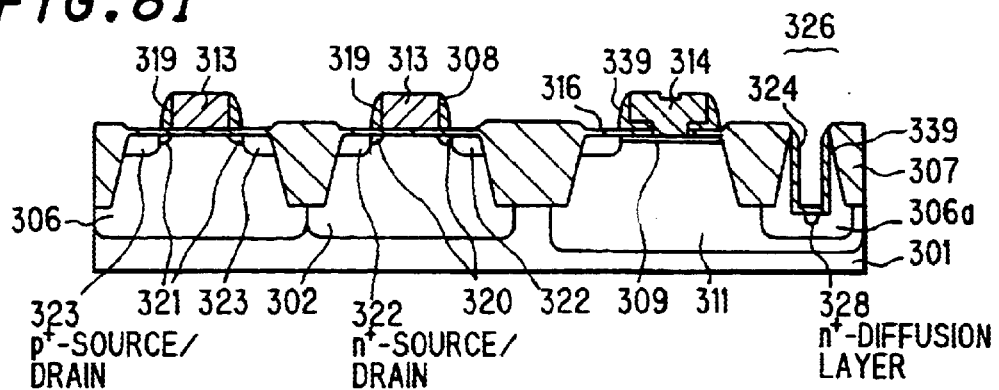
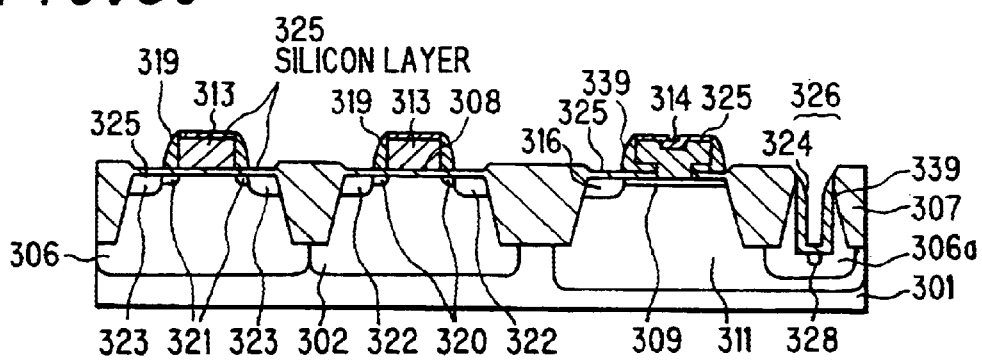
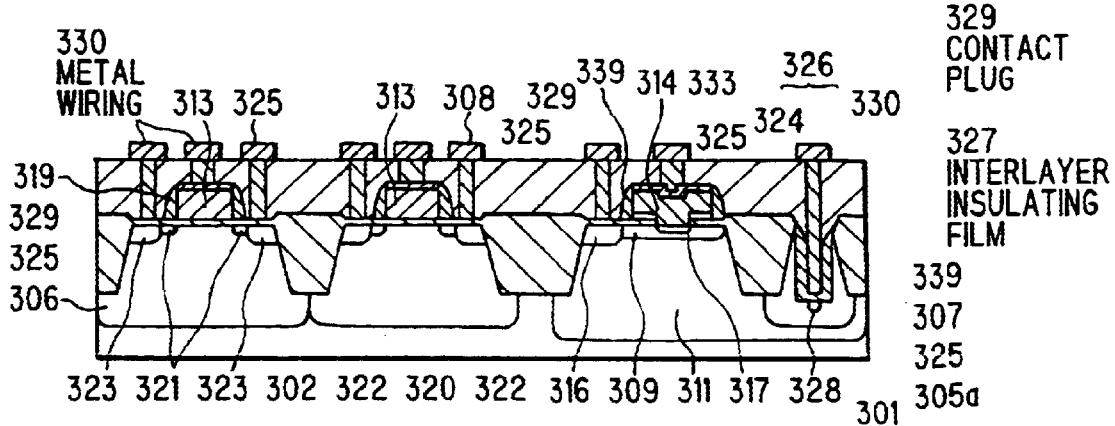

SEMICONDUCTOR DEVICE AND METHOD FOR MAKING THE SAME

This is a divisional of application Ser. No. 09/105,458 filed Jun. 26, 1998.

FIELD OF THE INVENTION

This invention relates to a semiconductor device formed combining a bipolar transistor with a complementary field-effect transistor (hereinafter referred to as 'CMOS') and a method for making the same.

BACKGROUND OF THE INVENTION

BiCMOS having a bipolar transistor and CMOS formed on a common substrate has both the high-speed operation and high driving performance of bipolar transistor and the low consumed power of CMOS. Thus, BiCMOS is one of the most effective means to meet recent demands for low consumed power and high-speed operation.

H. Suzuki et al., "Process Integration Technologies for a 0.3 μm BiCMOS SRAM with 1.5V Operation", IEEE, Proceedings of the 1996 Bipolar/BiCMOS Circuits and Technology Meeting, pp.89–92 (hereinafter referred to as 'first prior art') reports a bipolar transistor structure of BiCMOS.

In the first prior art (BiCMOS), the $n^+$-type buried layer must be diffused in the horizontal and vertical directions of the wafer due to the following three processes:

1) high-temperature thermal treatment in growing the epitaxial layer,
2) thermal treatment in forming the device-separating oxide film, and
3) thermal treatment for reducing the collector resistance.

Namely, these high-temperature thermal treatments prevent the size of bipolar transistor from being reduced.

Furthermore, in the first prior art, there is an essential problem that the number of fabrication steps must be increased since it needs to form the $n^+$-type buried layer and n-type epitaxial layer which are not necessary for CMOS.

In this regard, K. Ishimaru et al., "Bipolar Installed CMOS Technology without Any Process Step Increase for High Speed Cache SRAM", Technical Digest of International Electron Devices Meeting 1995, pp.673–676 (hereinafter referred to as 'second prior art') gives a solution to the above problems as to the transistor size and the number of BiCMOS fabricating steps.

In the second prior art, the $n^+$-type buried layer and epitaxial layer are not formed and the collector region is formed by the ion implantation at high energy. As a result, the problem that the transistor size is prevented from being decreased because of the unnecessary expansion in impurity region due to thermal hysteresis can be solved. Also, the essential problem that the number of fabrication steps of BiCMOS is too many can be solved by having some of the steps of fabricating CMOS and bipolar transistor in common.

However, in the second prior art, there occurs a new problem that the collector resistance is increased to six times, 300$\Omega$, compared with 50$\Omega$ of conventional BiCMOS, as described in Table 1 in the second prior art. The collector resistance has to be compared between transistors with a same size since it depends upon the transistor size. In experimenting on a transistor with a same size as that in the first prior art, a collector resistance of 450$\Omega$ is obtained.

On the other hand, the essential problem that the number of fabrication steps of BiCMOS is too many can be also solved by the following method. A through-process of BiCMOS is, in general, designed by combining a bipolar transistor into the process of fabricating CMOS as a base process or combining CMOS into the process of fabricating a bipolar transistor as a base process.

Accordingly, the essential problem can be solved by reducing the number of steps in the base process or the process for the component to be combined.

A specific example of such a method is disclosed in U.S. Pat. No. 5,358,882 (hereinafter referred to as 'third prior art') that the number of steps in fabricating a bipolar transistor is reduced.

As described above, in the first prior art, there is the problem that the size of bipolar transistor is prevented from being reduced because the $n^+$-type buried layer must be diffused in the horizontal and vertical directions of the wafer. Also, there is the essential problem that the number of BiCMOS fabrication steps must be increased.

In the second prior art, which can help solve these problems, there is the problem that the collector resistance of the bipolar transistor is increased because the collector region formed by the ion implantation must have a lowered impurity concentration.

Problems caused by an increase in collector resistance will be explained in FIG. 4. FIG. 4 shows a DC characteristics dependency to collector resistance in applying a voltage of 1.0V between the collector and emitter of a bipolar transistor. In FIG. 4, full lines indicate a characteristic in case of a collector resistivity of 200 $\Omega$, and dotted lines indicate a characteristic in case of a collector resistivity of 300 $\Omega$. As seen from the dotted lines in FIG. 4, in case of a collector resistivity of 300 $\Omega$, base current ($I_B$) is rapidly increased, compared with collector current ($I_C$), in a range of high base-to-emitter voltage ($V_{BE}$>1.0V). Thereby, the current-amplification factor (=$I_C/I_B$) of the bipolar transistor is rapidly decreased. In general, this phenomenon is called 'saturation', and it is know that such a phenomenon affects badly the circuit operation.

In the third prior art, the number of BiCMOS fabrication steps can be reduced without increasing the collector resistance. However, in the third prior art, the $n^+$-type buried layer formed on the p-type silicon substrate must be diffused, like the first prior art, in the horizontal direction due to the high-temperature thermal treatment in growing the epitaxial layer on the $n^+$-type buried layer. Because of this, the insulation separation width of the bipolar transistor must be increased, therefore preventing the transistor size from being reduced.

SUMMARY OF THE INVENTION

Accordingly, it is an object of the invention to provide a semiconductor device and a method for making a semiconductor device that the number of fabrication steps can be reduced and the size of bipolar transistor can be miniaturized without increasing a collector resistance.

According to the invention, a semiconductor device, comprises:

a bipolar transistor comprising a collector region of a second conductivity type formed from the surface of a semiconductor substrate of a first conductivity type, a base region of a first conductivity type formed from the surface of the collector region, and an emitter region of a second conductivity type formed from the surface of the base region;

a collector extraction region that is separated by an insulating layer and is formed in the collector region except the base region;

a concave portion in the collector extraction region that is formed up to a depth where the collector region has a peak concentration in impurity distribution; and a collector extraction electrode that is connected with the collector region to extract ohmic-connecting to the bottom of the concave portion.

According to another aspect of the invention, a semiconductor device, comprises:

a bipolar transistor comprising a collector region of a second conductivity type formed from the surface of a semiconductor substrate of a first conductivity type, a base region of a first conductivity type formed from the surface of the collector region, and an emitter region of a second conductivity type formed from the surface of the base region;

a collector extraction region that is separated by an insulating layer and is formed in the collector region except the base region;

a collector connection region that is formed in the collector extraction region and a second conductivity type of impurity is implanted with a concentration higher than the collector region;

a concave portion in the collector connection region that is formed up to a depth where the collector connection region or collector region has a peak concentration in impurity distribution; and a collector extraction electrode that is connected with the collector region to extract ohmic-connecting to the bottom of the concave portion.

According to another aspect of the invention, a semiconductor device, comprises:

a bipolar transistor comprising a collector region of a second conductivity type formed from the surface of a semiconductor substrate of a first conductivity type, a base region of a first conductivity type formed from the surface of the collector region, and an emitter region of a second conductivity type formed from the surface of the base region;

a collector extraction region that is separated by an insulating layer and is formed in the collector region except the base region;

a concave portion in the collector extraction region that is formed shallower than a depth where the collector region has a peak concentration in impurity distribution;

a diffusion layer that is formed from the bottom of the concave portion up to a depth where the collector region has the peak concentration in impurity distribution and a second conductivity type of impurity is implanted; and a collector extraction electrode that is connected with the collector region to extract ohmic-connecting to the bottom of the concave portion.

According to another aspect of the invention, a semiconductor device, comprises:

a bipolar transistor comprising a collector region of a second conductivity type formed from the surface of a semiconductor substrate of a first conductivity type, a base region of a first conductivity type formed from the surface of the collector region, and an emitter region of a second conductivity type formed from the surface of the base region;

a collector extraction region that is separated by an insulating layer and is formed in the collector region except the base region;

a collector connection region that is formed in the collector extraction region and a second conductivity type of impurity is implanted with a concentration higher than the collector region;

a concave portion in the collector connection region that is formed up to a depth where the collector connection region or collector region has a peak concentration in impurity distribution;

a diffusion layer that is formed from the bottom of the concave portion up to a depth where the collector connection region or collector region has the peak concentration in impurity distribution and a second conductivity type of impurity is implanted; and a collector extraction electrode that is connected with the collector region to extract ohmic-connecting to the bottom of the concave portion.

According to another aspect of the invention, a method for making a semiconductor device, comprises the steps of:

forming a collector extraction region that is separated by an insulating layer in a semiconductor substrate of a first conductivity type;

forming a collector region by implanting impurity of a second conductivity type into a region including the collector extraction region;

forming a base region by implanting impurity of a first conductivity type into a predetermined position in the collector region;

forming an emitter region by implanting impurity of a second conductivity type into a predetermined position in the base region;

forming a concave portion up to a depth where the collector region has a peak concentration in impurity distribution by removing selectively the collector extraction region with using the insulating layer as a mask; and forming a collector extraction electrode that is ohmic-connected with the bottom of the concave portion.

According to another aspect of the invention, a method for making a semiconductor device, comprises the steps of:

forming a collector extraction region that is separated by an insulating layer in a semiconductor substrate of a first conductivity type;

forming a collector region by implanting impurity of a second conductivity type into a region including the collector extraction region;

forming a collector connection region by implanting impurity of a second conductivity type with a concentration higher than the collector region into the collector extraction region;

forming a base region by implanting impurity of a first conductivity type into a predetermined position in the collector region;

forming an emitter region by implanting impurity of a second conductivity type into a predetermined position in the base region;

forming a concave portion up to a depth where the collector region or collector connection region has a peak concentration in impurity distribution by removing selectively the collector extraction region with using the insulating layer as a mask; and forming a collector extraction electrode that is ohmic-connected with the bottom of the concave portion.

According to another aspect of the invention, a method for making a semiconductor device, comprises the steps of:

forming a collector extraction region that is separated by an insulating layer in a semiconductor substrate of a first conductivity type;

forming a collector region by implanting impurity of a second conductivity type into a region including the collector extraction region;

forming a base region by implanting impurity of a first conductivity type into a predetermined position in the collector region;

forming an emitter region by implanting impurity of a second conductivity type into a predetermined position in the base region;

forming a concave portion with a depth shallower than that where the collector region has a peak concentration in impurity distribution by removing selectively the collector extraction region with using the insulating layer as a mask;

forming a diffusion layer from the bottom of the concave portion up to the depth where the collector region has the peak concentration in impurity distribution by implanting impurity of second conductivity type; and forming a collector extraction electrode that is ohmic-connected with the bottom of the concave portion.

According to another aspect of the invention, a method for making a semiconductor device, comprises the steps of:

forming a collector extraction region that is separated by an insulating layer in a semiconductor substrate of a first conductivity type;

forming a collector region by implanting impurity of a second conductivity type into a region including the collector extraction region;

forming a collector connection region by implanting impurity of a second conductivity type with a concentration higher than the collector region into the collector extraction region;

forming a base region by implanting impurity of a first conductivity type into a predetermined position in the collector region;

forming an emitter region by implanting impurity of a second conductivity type into a predetermined position in the base region;

forming a concave portion with a depth shallower than that where the collector region or collector extraction region has a peak concentration in impurity distribution by removing selectively the collector extraction region with using the insulating layer as a mask;

forming a diffusion layer from the bottom of the concave portion up to the depth where the collector region or collector extraction region has the peak concentration in impurity distribution by implanting impurity of second conductivity type; and forming a collector extraction electrode that is ohmic-connected with the bottom of the concave portion.

BRIEF DESCRIPTION OF THE DRAWINGS

The invention will be explained in more detail in conjunction with the appended drawings, wherein:

FIGS. 8A to 8K are cross sectional views showing the structure and fabrication method of a semiconductor device in a third preferred embodiment according to the invention.

DESCRIPTION OF THE PREFERRED EMBODIMENTS

Before explaining a semiconductor device and a method for making the same in the preferred embodiments, the aforementioned conventional bipolar transistor and its fabrication method in the first to third prior arts will be explained in FIGS. 1A to 3F.

The method for making the bipolar transistor in the first prior art will be explained in FIGS. 1A to 1F.

Figure 1A:
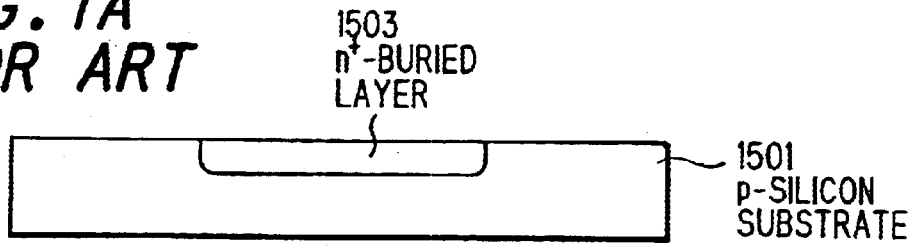
FIGS. 1A to 1F are cross sectional views showing the structure and fabrication method of a bipolar transistor in the first prior art.

As shown in FIG. 1A, a $n^+$-type buried layer 1503 is first formed on a p-type silicon substrate 1501 by ion-implanting, e.g., arsenic or antimony of $10^{15}$ to $10^{16}$ cm$^{-2}$ at 30 to 100 keV into the substrate 1501.

Figure 1B:
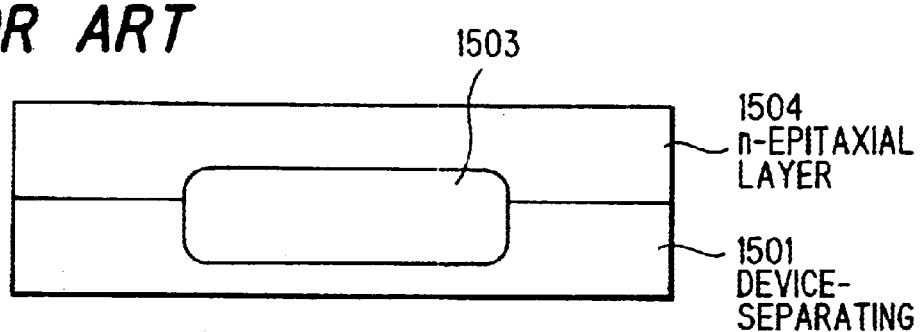

Then, as shown in FIG. 1B, a n-type epitaxial layer 1504 of 0.6 to 1.5 μm thick is grown on the substrate 1501. The epitaxial layer 1504 is formed by using a known epitaxial growth technique, e.g., depositing silicon on a wafer while thermally decomposing a gas of SiCl4, SiH2Cl2, SiH4 or the like at a high temperature of 100 to 1200° C.

At this time, as seen from the comparison of FIGS. 1A and 1B, the $n^+$-type buried layer 1503 is expanded diffusing in the horizontal and vertical directions. This is because the implanted impurity is diffused by the high temperature treatment of 1000 to 1200° C. for growing the epitaxial layer. The diffusion occurs in the horizontal and vertical directions of the wafer. It is known that the diffusing region is raised 0.2 to 0.3 μm forward the wafer surface by the diffusion.

Figure 1C:
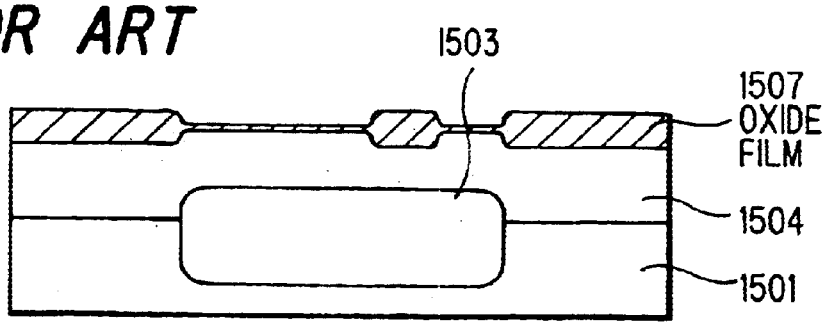

Then, as shown in FIG. 1C, device-separating oxide film 1507 of 250 to 600 nm thick is formed at a temperature of 900 to 110° C. by using, e.g., a known LOCOS separation method. At this time, the $n^+$-type buried layer 1503 is further thermally diffused in the horizontal and vertical directions, compared with that in FIG. 1B (though this is not shown clearly in FIG. 1C).

Figure 1D:
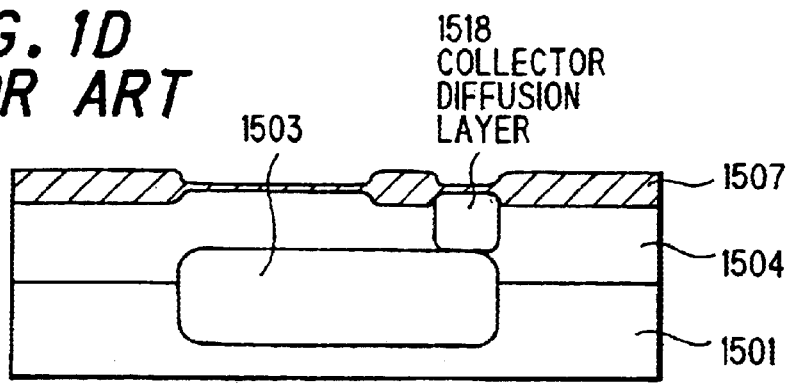

Then, as shown in FIG. 1D, a collector diffusion layer 1518 is formed by ion-implanting, e.g., phosphorus, arsenic of $1\times10^{15}$ to $1\times10^{16}$ cm$^{-2}$ at 50 to 100 keV into a predetermined position of the n-type epitaxial layer 1504.

Figure 1E:
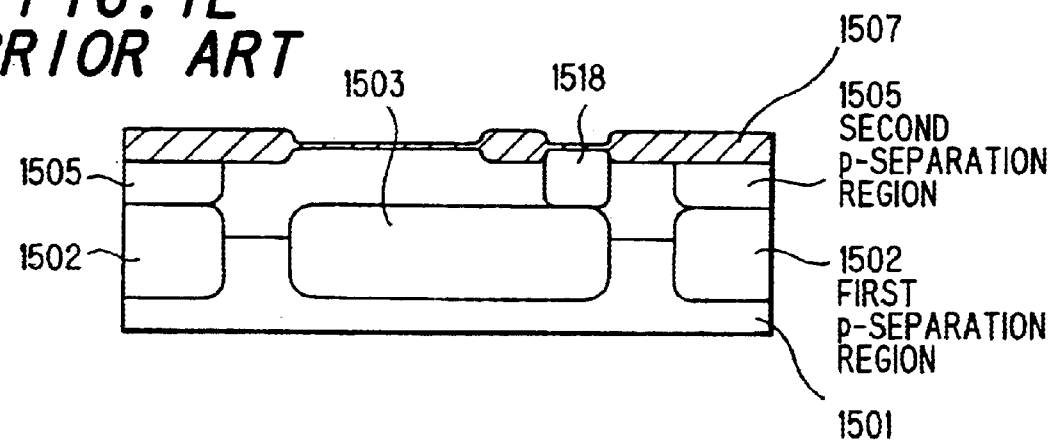

Then, as shown in FIG. 1E, a first p-type separation region 1502 is formed by ion-implanting, e.g., boron of $1\times10^{13}$ to $5\times10^{14}$ cm$^{-2}$ at a high energy of 500 keV to 1.5 MeV. Further, a second p-type separation region 1505 is formed by ion-implanting boron of $1\times10^{13}$ to $5\times10^{14}$ cm$^{-2}$ at 100 to 250 keV.

Figure 1F:
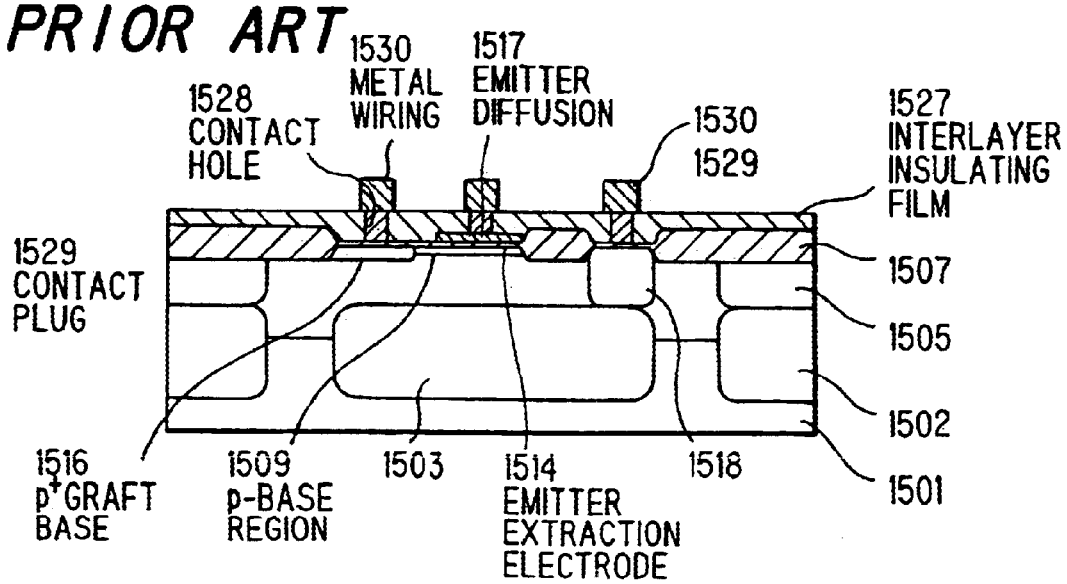

Then, as shown in FIG. 1F, a p-type base region 1509, an emitter extraction electrode 1514, p$^+$-type graft base 1516 etc. are formed by using known techniques. Then, after forming interlayer insulating film 1527 on them, contact holes 1528 are formed at predetermined positions and then contact plugs 1529 are plugged thereinto. Then, metal wiring 1530 is formed connecting with the contact plugs 1529.

By the process described above, BiCMOS in FIG. 1F can be obtained. Namely, the n$^+$-type buried layer 1503 and n-type epitaxial layer 1504 are formed on the p-type silicon substrate 1501. Also, the collector extraction can be expanded by the collector diffusion layer 1518. Also, the first and second p-type separation regions 1502, 1505 allow the insulation separation from other transistors to be formed on the common substrate. Further, there are formed the p-type base region 1509 and an emitter diffusion layer 1517 for the bipolar transistor in the n-type epitaxial layer 1504.

Meanwhile, in a bipolar transistor used in BiCMOS, the collector connection is generally extracted from the device surface. Because of this, a resistivity (collector resistance) from the collector region formed in the n-type epitaxial layer 1504 under the p-type base region 1509 to the metal wiring 1530 as collector electrode is a problem to be solved.

Until recently, a collector region with a high-concentration impurity introduced could not be formed by the ion implantation. Due to this, as described above, in general, the collector region is formed by using the n-type epitaxial layer 1504 and is connected through the n$^+$-type buried layer 1503, collector diffusion layer 1518 and contact plug 1529 to the metal wiring 1530.

In this case, to minimize the connector resistance, it is ideal that the n$^+$-type buried layer 1503 and the collector diffusion layer 1518 are connected with each other while they have high-concentration impurities. However, informing the collector diffusion layer 1518, the peak of impurity concentration is 0.12 μm deep even by implanting phosphorus at the highest implantation energy. In this regard, the n-type epitaxial layer 1504 has to have a thickness of 0.6 μm at the minimum. Also, the rising of the n$^+$-type buried layer 1503 forward the wafer surface due to the thermal hysteresis is about 0.3 μm at the maximum. Therefore, when the ion implantation is simply conducted, a clearance between the top of the n$^+$-type buried layer 1503 and the bottom of the collector diffusion layer 1518 must be greater than 0.18 μm. In brief, the ideal connection between the n$^+$-type buried layer 1503 and the collector diffusion layer 1518 cannot be obtained.

To reduce the clearance of 0.18 μm to allow the collector diffusion layer 1518 to contact the n$^+$-type buried layer 1503, the collector diffusion layer 1518 formed by the ion implantation needs to be expanded diffusing by thermal treatment, e.g., at a temperature of 900 to 1000° C. for 30 to 60 min. It is apparent that, due to the thermal treatment, both the n$^+$-type buried layer 1503 and the collector diffusion layer 1518 will be further expanded diffusing in the horizontal and vertical directions of the wafer.

The method for making BiCMOS in the second prior art will be explained in FIGS. 2A to 2E.

Figure 2A:
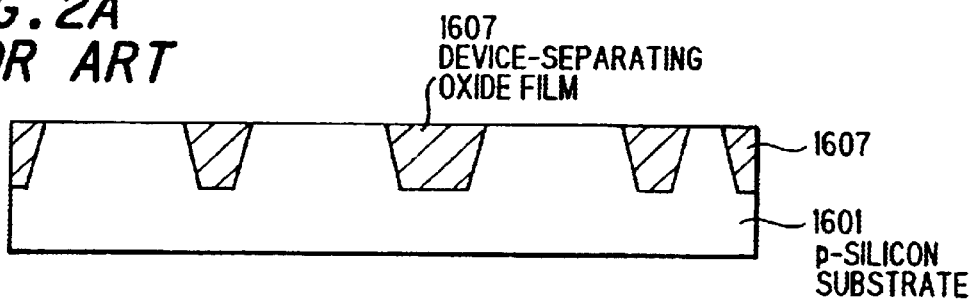
FIGS. 2A to 2E are cross sectional views showing the structure and fabrication method of a bipolar transistor in the second prior art.

As shown in FIG. 2A, device-separating oxide film 1607 of 0.7 μm deep is first formed on a p-type silicon substrate 1601 by a known technique. Meanwhile, in the second prior art, the device-separating oxide film 1607 is called 'STI (shallow trench isolation'.

Figure 2B:
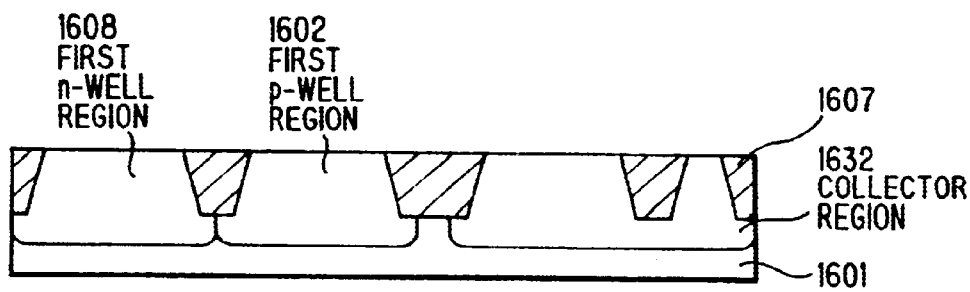

Then, as shown in FIG. 2B, a first p-type well region 1602 is formed by ion-implanting boron of $5\times10^{13}$ cm$^{-2}$ at 350 keV. Also, a first n-type well region 1606 is formed by ion-implanting phosphorus of $5\times10^{13}$ cm$^{-2}$ at 700 keV.

At this time, an insulation separation region for bipolar transistor is simultaneously formed with the first p-type well region 1602. Also, in the second prior art, a collector region 1632 for bipolar transistor is simultaneously formed with the first n-type well region 1606. Namely, the collector region 1632 is formed by the ion implantation.

Thus, in the second prior art, the impurity concentration necessary for collector can be obtained by the ion implantation. Because of this, for example, the epitaxial layer is not necessary to form. Therefore, the number of fabrication steps can be significantly decreased, compared with that in the first prior art.

Figure 2C:
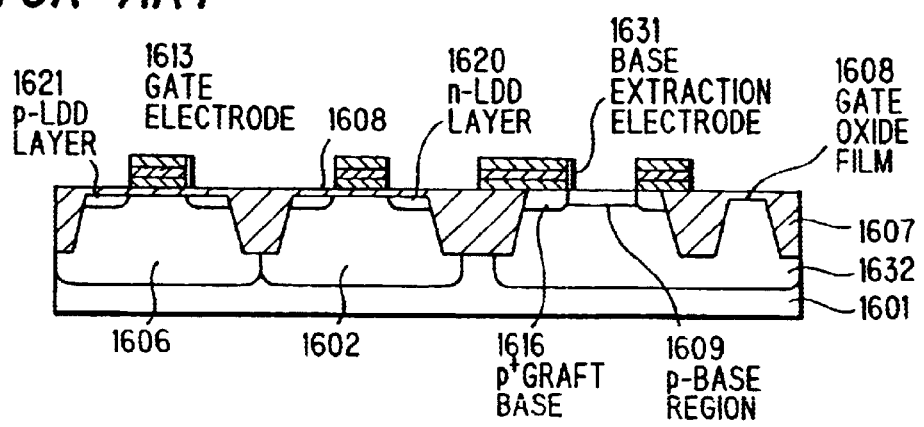

Then, as shown in FIG. 2C, gate oxide film 1608 of 7 nm thick is formed. Then, the gate oxide film 1608 locating at a region to form a base extraction electrode is removed. Then, p$^+$-type and n$^+$-type gate electrodes 1613 and the base extraction electrode 1631 with a multilayer structure that insulating film is formed on a polycide structure are formed. Then, a n-type LDD layer 1620, a p-type LDD layer and a p-type base region 1609 are formed.

Meanwhile, the impurity doping to the base extraction electrode 1631 is conducted in forming the p$^+$-type gate electrode 1613. Also, the p-type base region 1609 is simultaneously formed with the p-type LDD layer 1621. Further, a p$^+$-type graft base 1616 is formed by diffusing boron from the base extraction electrode 1631 by the thermal treatment of the fabrication process.

Figure 2D:
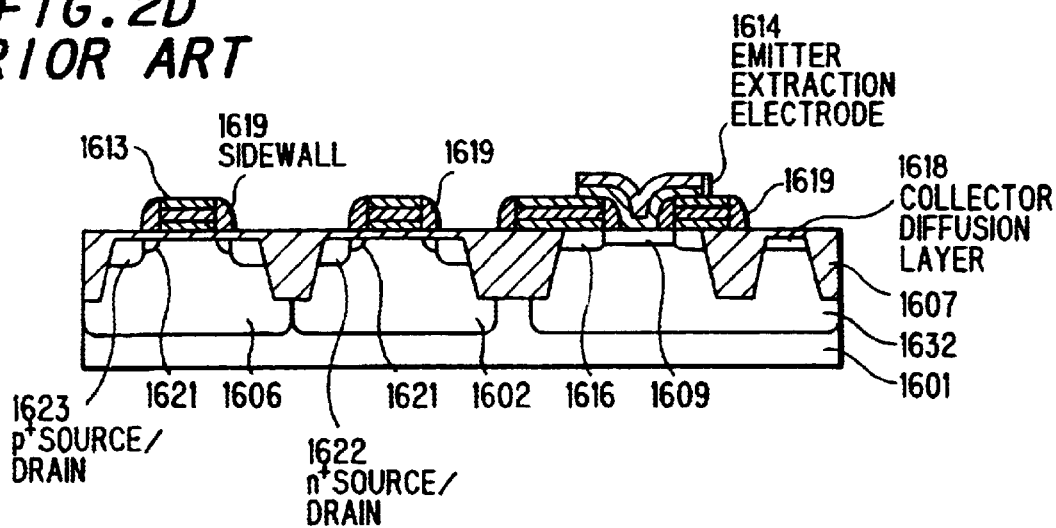

Then, as shown in FIG. 2D, side walls 1619 of silicon dioxide film etc. are formed on the side of the gate electrode 1613 and base extraction electrode 1631 by using a known technique. Then, by ion-implanting in self-aligned manner with using these as a mask, a n$^+$-type source/drain 1622, a p$^+$-type source/drain 1623 and a collector diffusion layer 1618 are formed. Then, an emitter extraction electrode 1614 with a polycide structure is formed. Meanwhile, the collector diffusion layer 1618 is simultaneously formed with the n$^+$-type source/drain 1622 for n-MOS.

Figure 2E:
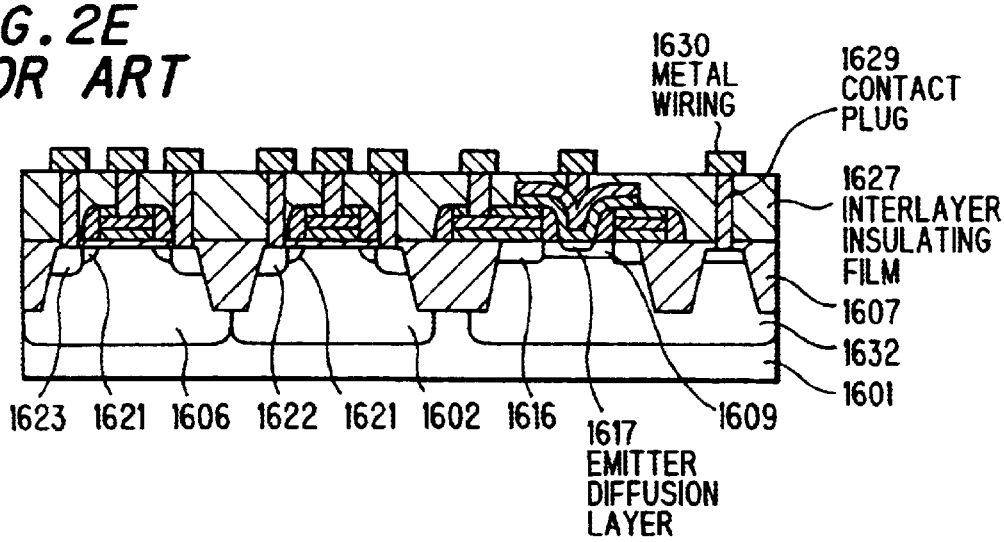

Then, as shown in FIG. 2E, an emitter diffusion layer 1617, interlayer insulating film 1627, contact plugs 1629 and metal wiring 1630 are formed by a known technique.

By the process described above, as shown in FIG. 2E, the collector region 1632 as well as the first n-type well region 1606 for CMOS is formed on the p-type silicon substrate 1601 by ion implantation. Also, the collector extraction can be conducted by the collector diffusion layer 1618 formed simultaneously with the n$^+$-type source/drain 1622 for n-MOS. Also, the first p-type well region 1602 allows the insulation separation from other transistors to be formed on the common substrate. Further, there are formed the p-type base region 1609 and emitter diffusion layer 1617 for the bipolar transistor in the collector region 1632 formed on the p-type silicon substrate 1601.

In the second prior art, the n$^+$-type buried layer 1503 and n-type epitaxial layer 1504 in FIG. 1F are not employed.

The process of fabricating a bipolar transistor in the third prior art will be explained in FIGS. 3A to 3F.

Figure 3A:
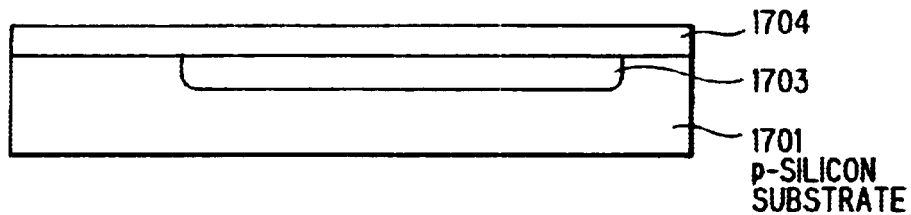
FIGS. 3A to 3F are cross sectional views showing the structure and fabrication method of a bipolar transistor in the third prior art.

At first, as shown in FIG. 3A, a n$^+$-type buried layer 1703 is formed on a p-type silicon substrate 1701 by ion-implanting arsenic or antimony using oxide film as a mask. Then, a n-type epitaxial layer 1704 of 0.2 to 0.5 μm is formed.

Figure 3B:
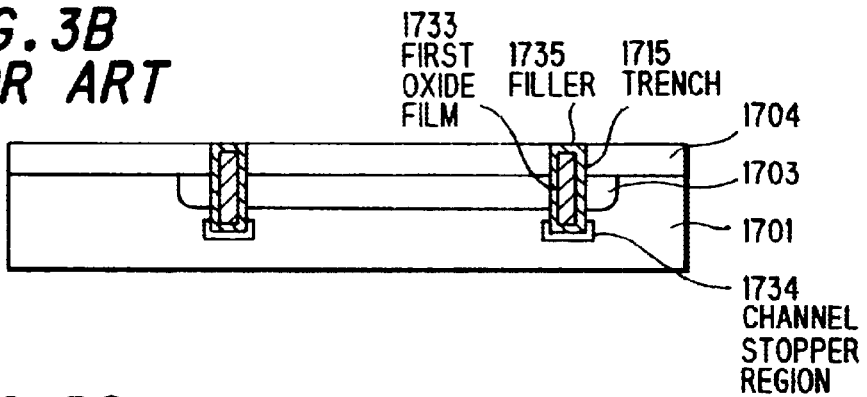

Then, for example, silicon thermal oxidation film, silicon nitride film and TEOS silicon dioxide film of 50 nm, 150 nm and 600 nm, respectively, are formed as a hard mask for forming a trench, and then an aperture to surround the bipolar transistor is formed by photolithography. Then, as shown in FIG. 3B, the trench 1715 that reaches the p-type silicon substrate 1701 penetrating through the n⁺-type buried layer 1703 is formed by digging 4.4 μm deep from the surface of the n-type epitaxial layer 1704 by known anisotropic etching.

Then, after growing first oxide film 1733 of 50 to 100 nm on the side wall and the bottom of the trench 1715, a channel stopper region 1734 is formed in the p-type silicon substrate 1701 under the bottom of the trench 1715. Then, a filler 1735 of oxide film doped or non-doped by CVD is filled into the inside of the trench 1715, and then the filler 1735 is removed up to the surface of the n-type epitaxial layer 1704 by a known etching technique while leaving the silicon thermal oxidation film of 50 nm. Then, second oxide film 1737 of 100 nm is formed by thermal oxidation to cap the trench.

Figure 3C:
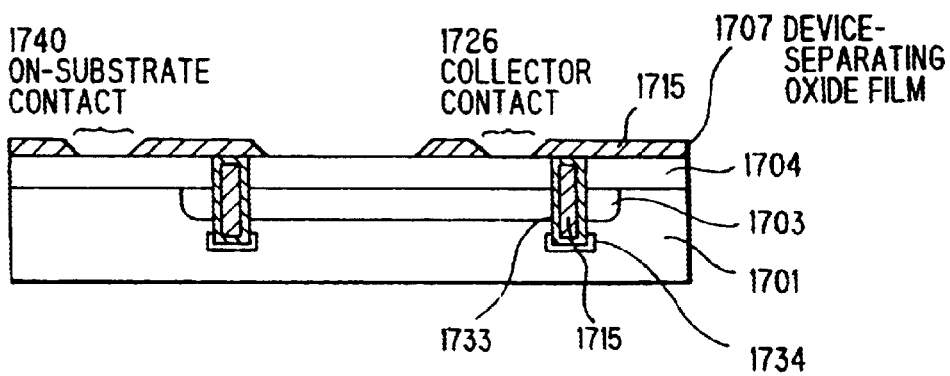

Then, as shown in FIG. 3C, device-separating oxide film (TEOS-SiO₂ film) 1707 of 200 to 500 nm is formed by CVD using a gas of $Si(OC_2H_5)_4$ at 730° C. Then, an active transistor region including emitter, base and collector, a collector contact 1726 and an on-substrate contact 1740 are positioned by photolithography using photoresist, and then the device-separating oxide film 1707 is selectively removed by a known etching technique to expose the surface of the n-type epitaxial layer.

Figure 3D:
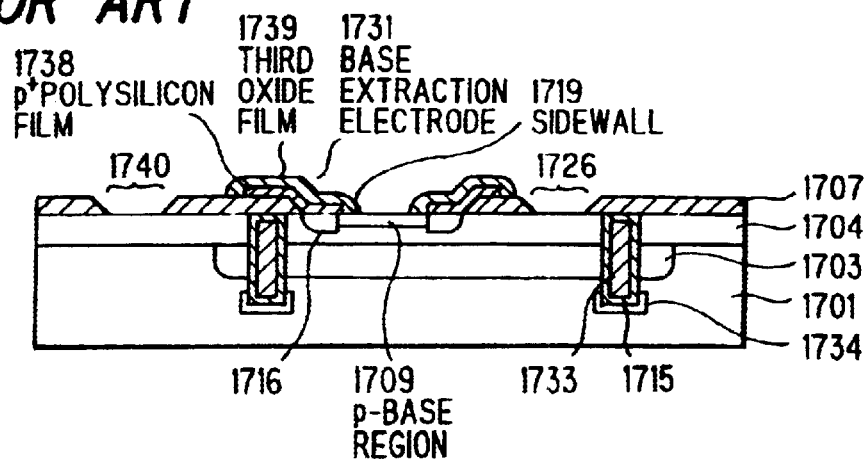

Then, as shown in FIG. 3D, p⁺-type polysilicon film 1738 and third oxide film 1739 are grown. Then, a base extraction electrode 1731 is formed by etching simultaneously the third oxide film 1739 and p⁺-type polysilicon film 1738 by a known anisotropic etching. Then, a p-type base region (active base region) 1709 is formed by ion-implanting boron or $BF_2$ of $5 \times 10^{13}$ cm⁻² at 15 keV while using photoresist as a mask. Further, side walls 1719 of oxide film are formed.

Figure 3E:
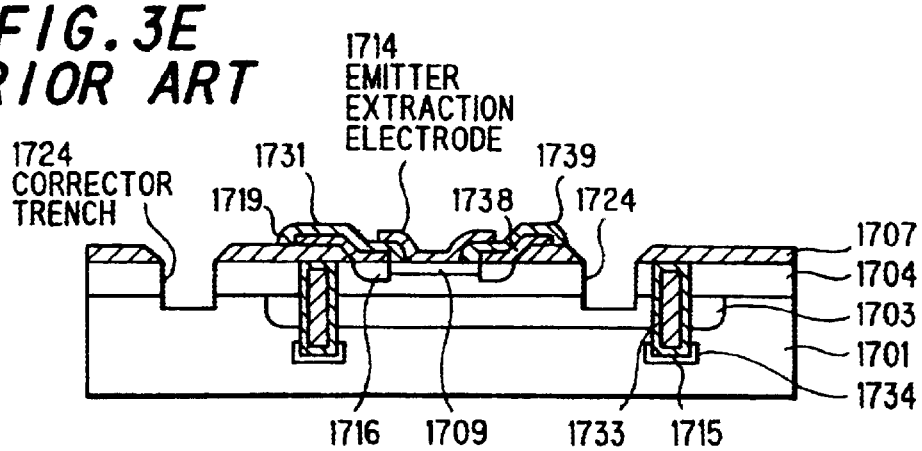

Then, as shown in FIG. 3E, an emitter extraction electrode 1714 is formed by growing n⁺-type-doped polysilicon and then etching selectively by anisotropic etching using photoresist as a mask. Then, a collector trench 1724 is formed by further over-etching the on-substrate contact 1740 until reaching the n⁺-type buried layer 1703. At this time, a collector trench 1724 is simultaneously formed etching the collector contact 1726.

Figure 3F:
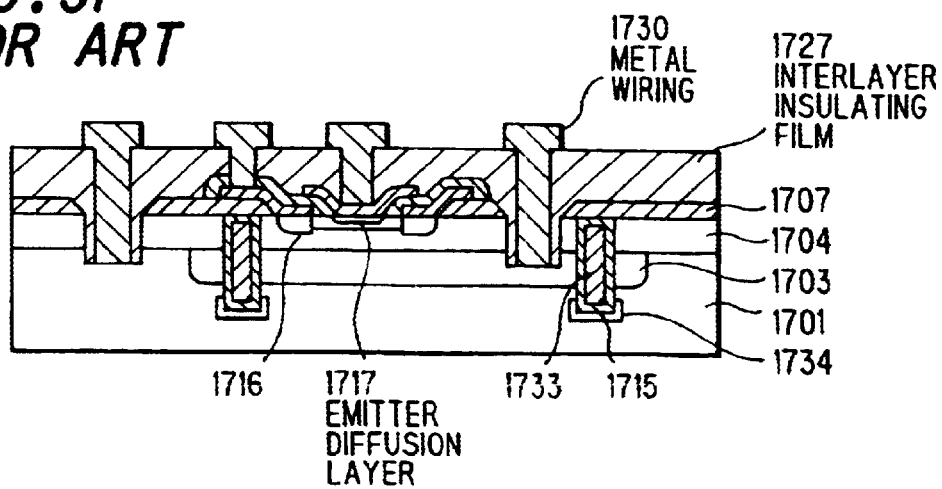

Then, as shown in FIG. 3F, interlayer insulating film 1727 composed of oxide film (TEOS-SiO₂ film) of 50 nm and BPSG (boronphosphorus-silicate-glass) of 800 nm is formed. Then, an emitter diffusion layer 1717 is formed by, for example, RTA (rapid thermal annealing) at 1050° C. for 5 to 15 sec. or furnace annealing at 900° C. for 20 to 30 min. Then, contact holes are formed and metal wiring 1730 is formed.

As described above, in the third prior art, when the pattern of the emitter extraction electrode 1714 is formed by etching, the collector trench 1724 is also formed by etching the surface of the n-type epitaxial layer 1704. Also, at the bottom of the collector trench 1724, the n⁺-type buried layer 1703 and metal wiring 1730 are directly connected.

Thus, the collector diffusion layer 1518 for collector extraction in the first prior art is not necessary to form. As a result, the number of fabrication steps can be reduced. Also, in the third prior art, the collector resistance is not increased.

Next, a semiconductor device and a method for making the same in the first preferred embodiment will be explained in FIGS. 5A to 5H.

At first, referring to FIG. 5H, the structure of a bipolar transistor in the semiconductor device in the first embodiment will be explained below.

In the bipolar transistor, a n-well region 106 and a collector region 106a are formed on a p-type silicon substrate 101. A collector contact 126 and a p-type base region 109 are separated from each other by device-separating oxide film 107 formed on the surface of the collector region 106a. Also, in the region of the collector contact 126, the bottom of a collector trench (concave portion) 124 is formed to abut on a portion with peak impurity concentration in the collector region 106a.

Also, side walls 119 are formed on the side of the collector trench 124. A n⁺-type diffusion layer 128 to be formed in implanting n⁺-type source/drain for CMOS is formed at part of the bottom of the collector trench 124 where the side wall 119 is not left. Also, a silicide layer 125a is formed on the surface of n⁺-type diffusion layer 128. It is connected through barrier metal (not shown) and a contact plug 129 or not through the contact plug to metal wiring 130.

Meanwhile, the bottom of the collector trench 124 may be formed a little higher than the portion with peak impurity concentration in the collector region 106a so that a portion with peak impurity concentration in the n⁺-type diffusion layer 128 can abut on the portion with peak impurity concentration in the collector region 106a.

Next, the method for making the semiconductor device in the first embodiment will be explained in FIGS. 5A to 5H.

Figure 5A:
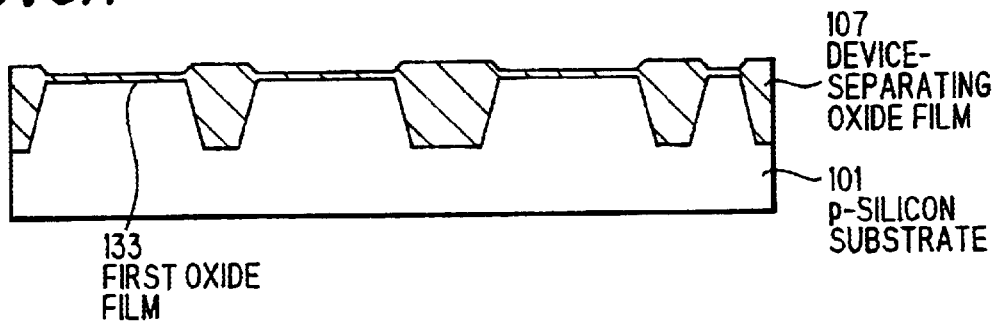
FIGS. 5A to 5H are cross sectional views showing the structure and fabrication method of a semiconductor device in a first preferred embodiment according to the invention.

At first, as shown in FIG. 5A, device-separating oxide film 107 and first oxide film 133 are formed on the p-type silicon substrate 101 by using known LOCOS or STI etc.

Figure 5B:
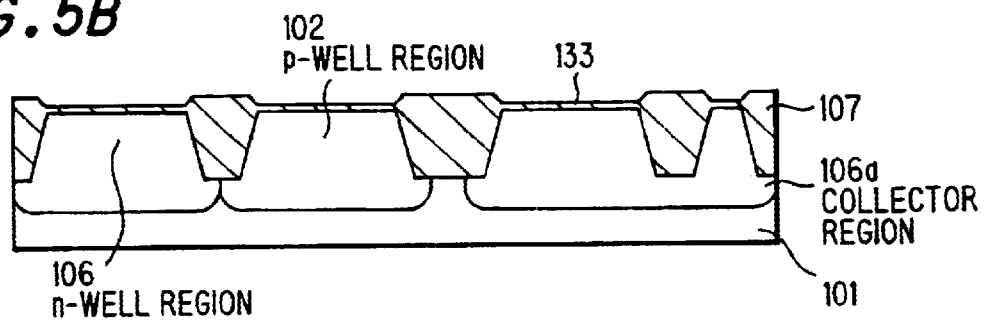

Then, as shown in FIG. 5B, a p-well region 102 to form n-MOS is formed by implanting, e.g., boron of $5 \times 10^{13}$ cm⁻² at 350 keV. Also, a n-well region 106 to form p-MOS and a collector region 106a to form the collector of the bipolar transistor are formed by implanting phosphorus of $5 \times 10^{13}$ cm⁻² at 700 keV.

Figure 5C:
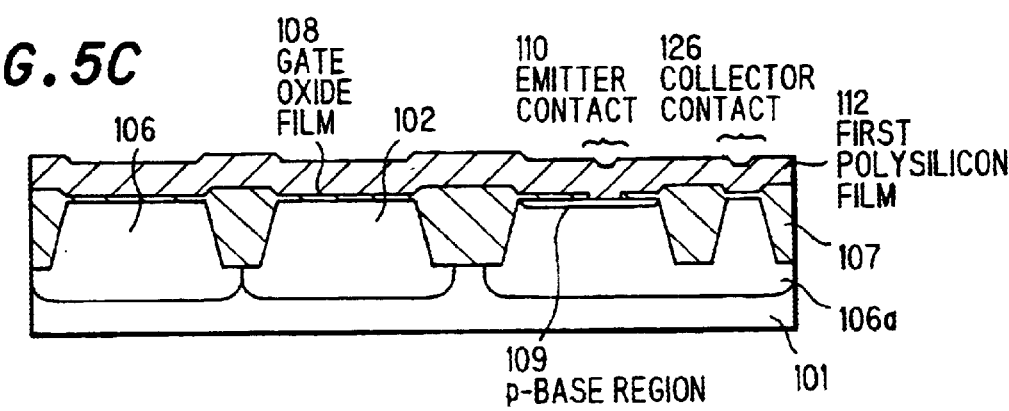

Then, as shown in FIG. 5C, gate oxide film 108 of 5 to 10 nm is formed on the p-type silicon substrate 101. Then, a p-type base region 109 is formed by implanting, e.g., boron or $BF_2$ of $1 \times 10^{13}$ to $5 \times 10^{14}$ cm⁻² at 10 to 50 keV. Also, after forming an emitter contact 110 and a collector contact 126, first polysilicon film 112 of 150 to 400 nm is grown.

Figure 5D:
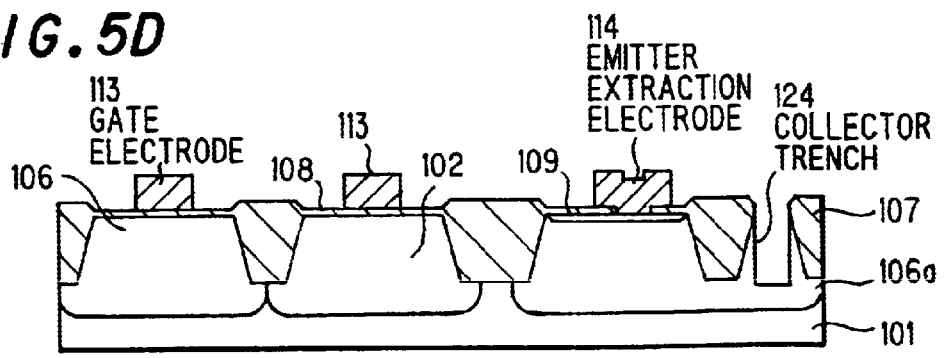

Then, as shown in FIG. 5D, gate electrodes 113 and an emitter extraction electrode 114 are formed by known anisotropic etching using a pattern, such as photoresist, as a mask. Then, the collector trench 124 is formed by further etching it using the photoresist pattern and gate oxide film 108 as a mask. Then, the mask of photoresist is removed. Meanwhile, these etchings may be conducted sequentially on same conditions or separately in several steps.

Figure 5E:
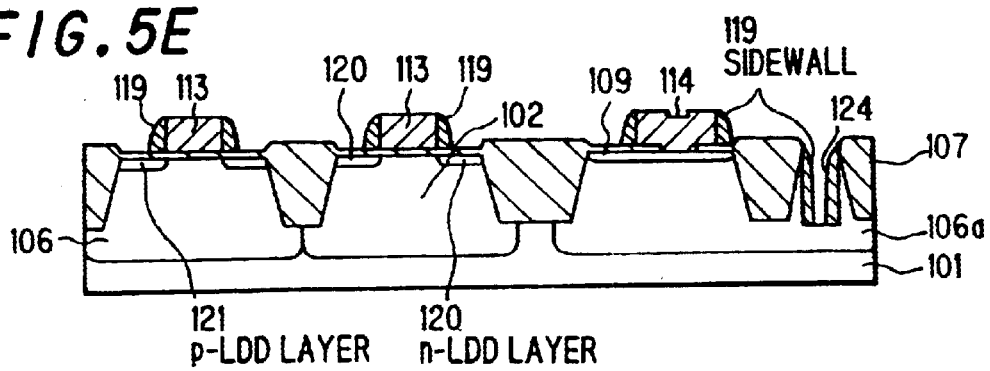

Then, as shown in FIG. 5E, a n-type LDD layer 120 and a p-type LDD 121 are formed. Then, after forming oxide film for side wall, the side walls 119 are formed on the side of the gate electrode 113, emitter extraction electrode 114 and collector trench 124 by known anisotropic etching.

Figure 5F:
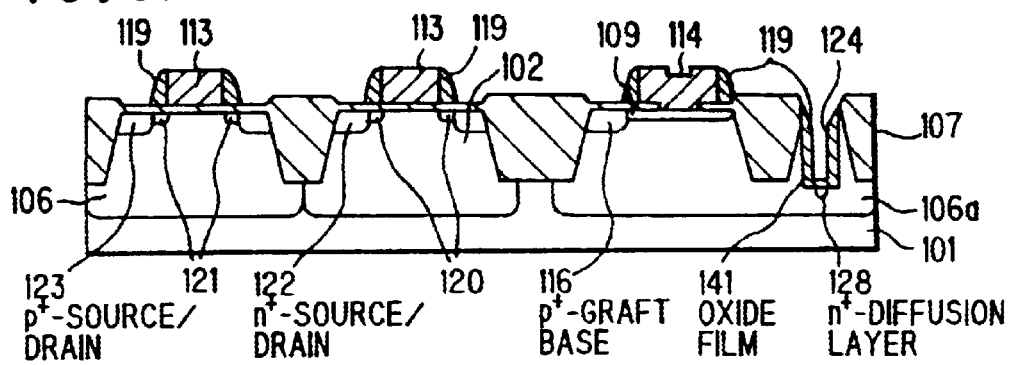

Then, as shown in FIG. 5F, a n⁺-type source/drain region 122 for n-MOS is formed by ion-implanting impurity of phosphorus, arsenic or the like. Also, the n⁺-type diffusion layer 128 is formed at the bottom of the collector trench 124. Then, a p⁺-type source/drain region 123 for p-MOS and a p⁺-type graft base 116 are formed by ion-implanting impurity of boron, $BF_2$ or the like.

Meanwhile, the impurity introduction into the emitter extraction electrode 114 may be conducted simultaneously with the ion implantation of impurity of phosphorus, arsenic or the like to form the n+-type source/drain region 122 for n-MOS. Alternatively, it may be conducted by another step of implanting impurity of phosphorus, arsenic or the like.

Also, it is desired that these ion implantations be conducted through thin oxide film 141 of about 5 to 20 nm to be further formed on, e.g., the exposed surface of the p-type silicon substrate 101 so as to prevent a crystal defect at the end of the side wall 119.

Figure 5G:
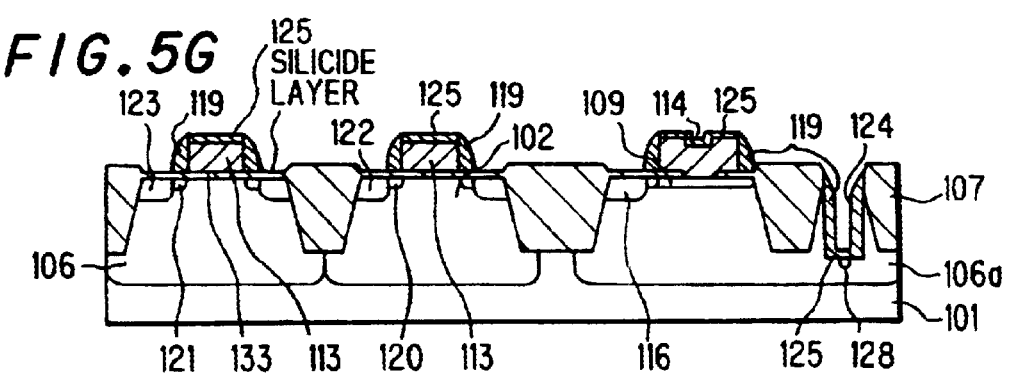

Then, as shown in FIG. 5G, a silicide layer 125 or 125a is formed by siliciding the surface of the gate electrode 113, emitter extraction electrode 114, n+-type diffusion layer 128 at the bottom of the collector trench 124, n+-type source/drain region 122, p+-type source/drain region 123 and p+-type graft base 116 by known method using metal of titanium, cobalt, nickel or the like.

Figure 5H:
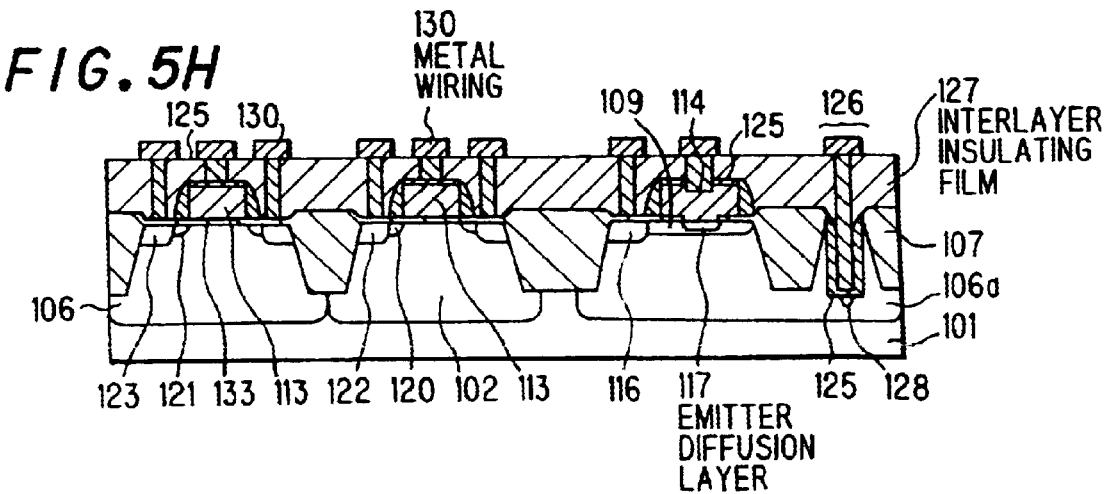

Then, as shown in FIG. 5H, interlayer insulating film 127 composed of, e.g., oxide film (TEOS-SiO$_2$ film) of 50 nm and BPSG (boron-phosphorus-silicate-glass) of 800 nm like the third prior art is formed. In addition, contacts are formed at predetermined positions of the interlayer insulating film 127, and then the contact plug 129 are formed through barrier metal (not shown). Then, the metal wiring 130 to contact the contact plug 129 is formed on the interlayer insulating film 127. Though, in FIG. 5H, the contact width for the collector trench 124 is shown to be smaller than the width of the collector trench 124, it may be equal to or greater than that of the collector trench 124.

As described above, in the first embodiment, the n+-type buried layer and epitaxial layer are not formed and the collector region is formed by the ion implantation at high energy. As a result, the problem that the transistor size is prevented from being decreased because of the unnecessary expansion in impurity region due to thermal hysteresis can be solved.

Also, in the first embodiment, the collector resistance is not increased because the collector region 106a and the contact plug 129 connected to the metal wiring 130 are directly connected at the bottom of the collector trench 124.

Further, the collector trench 124 is formed by etching with using the photoresist pattern and device-separating oxide film 107 as a mask, subsequently after forming the gate electrode 113 and emitter extraction electrode 114. Therefore, the number of fabrication steps is not increased. Namely, in the first embodiment, the essential problem that the number of fabrication steps of BiCMOS is too many can be solved by having some of the steps of fabricating CMOS and bipolar transistor in common.

However, in the first embodiment, as shown in FIG. 5D, the collector trench 124 is formed by etching with using the photoresist pattern and gate oxide film as a mask. Because of this, it will be difficult to use the gate oxide film as a mask when the thickness of the gate oxide film is reduced to miniaturize the transistor. In this regard, a method for making a semiconductor device in the second embodiment will give a solution.

The method for making a semiconductor device in the second preferred embodiment will be explained below.

Figure 6A:
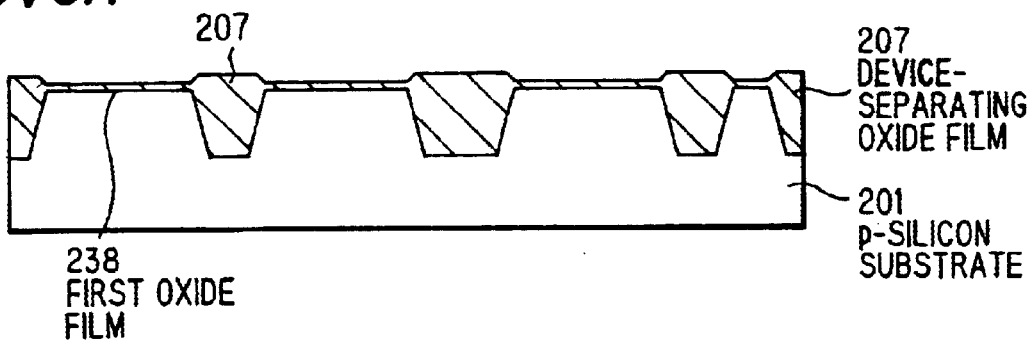
FIGS. 6A to 6K are cross sectional views showing the structure and fabrication method of a semiconductor device in a second preferred embodiment according to the invention.

At first, as shown in FIG. 6A, device-separating oxide film 207 and first oxide film 233 are formed on the p-type silicon substrate 201 by using known LOCOS or STI etc.

Figure 6B:
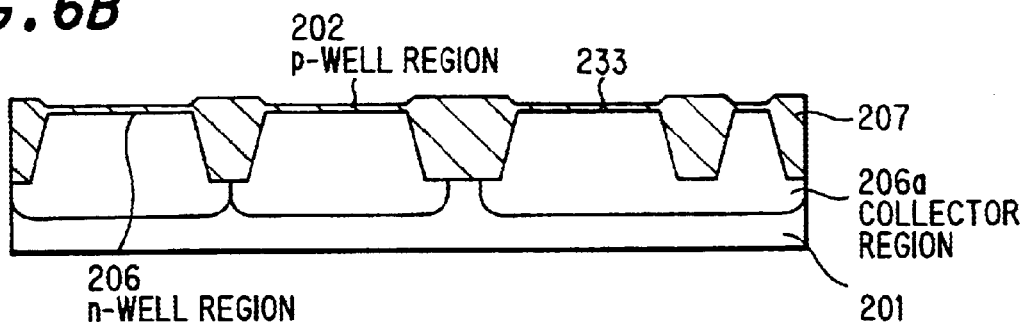

Then, as shown in FIG. 6B, a p-well region 202 to form n-MOS is formed by implanting, e.g., boron of $5\times10^-$cm$^{-2}$ at 350 keV. Also, a n-well region 206 to form p-MOS and a collector region 206a to form the collector of the bipolar transistor are formed by implanting phosphorus of $5\times10^{13}$ cm$^{-2}$ at 700 keV.

Figure 6C:
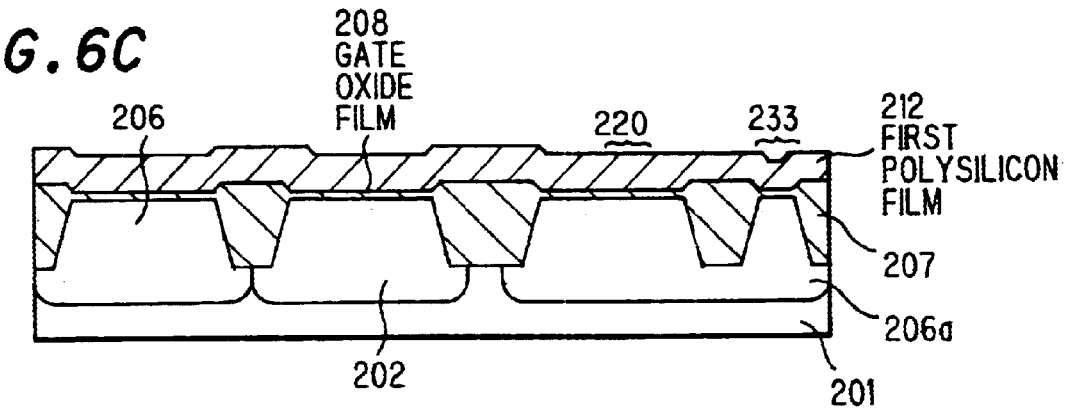

Then, as shown in FIG. 6C, gate oxide film 208 of 5 to 10 nm is formed on the p-type silicon substrate 101. Then, first polysilicon film 212 of 150 to 400 nm is formed.

Figure 6D:
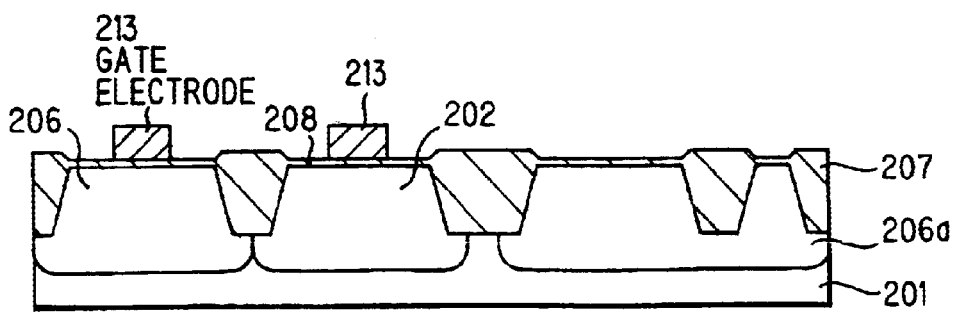

Then, as shown in FIG. 6D, gate electrodes 213 are formed by removing selectively the first polysilicon film 212 by known anisotropic etching with using a photoresist pattern, and then the photoresist pattern is removed.

Figure 6E:
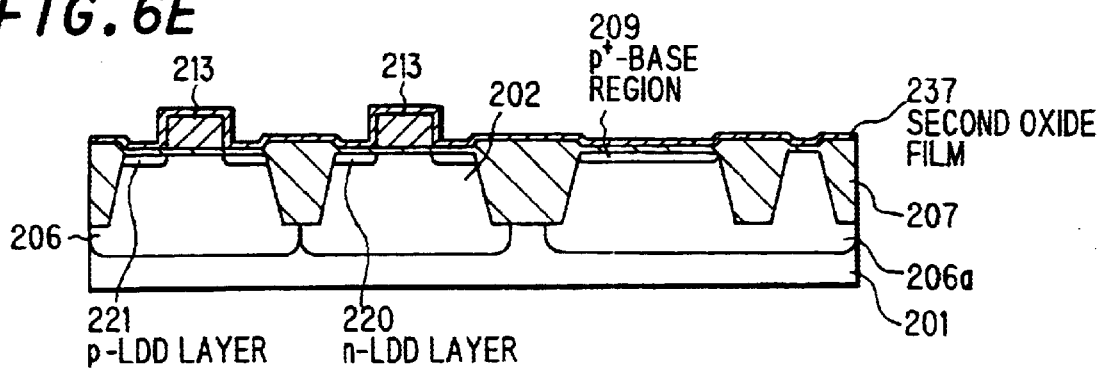

Then, as shown in FIG. 6E, a p-type base region 209 is formed by implanting, e.g., boron or BF$_2$ of $1\times10^{13}$ to $5\times10^{14}$ cm$^{-2}$ at 10 to 50 keV. Then, a n-type LDD layer 220, a p-type LDD layer 221 are formed. Then, second oxide film 237 is grown.

Figure 6F:
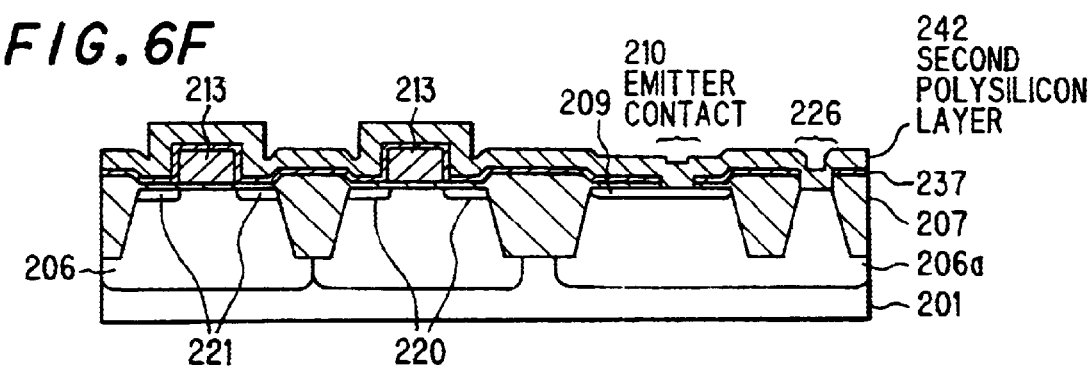

Then, as shown in FIG. 6F, an emitter contact 210 and a collector contact 226 are formed by etching selectively the second oxide film 237 with using a photoresist mask pattern. Then, second polysilicon film 242 of 150 to 400 nm is grown.

Meanwhile, the second polysilicon film 242 may be grown non-doping or doping with impurity of, e.g., phosphorus or arsenic, of $1\times10^{18}$ and $1\times10^{21}$ cm$^{-2}$.

Figure 6G:
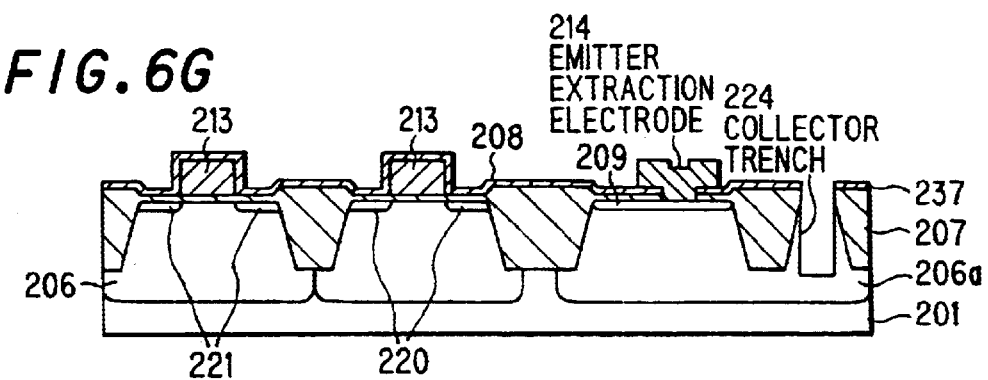

Then, as shown in FIG. 6G, an emitter extraction electrode 214 is formed by removing selectively the polysilicon film 242 by known anisotropic etching with using a photoresist mask pattern. Then, a collector trench 224 is formed by further etching with using the photoresist pattern and second oxide film 237 as a mask. Then, the photoresist pattern is removed. These etchings may be conducted sequentially on same conditions or separately in several steps.

Figure 6H:
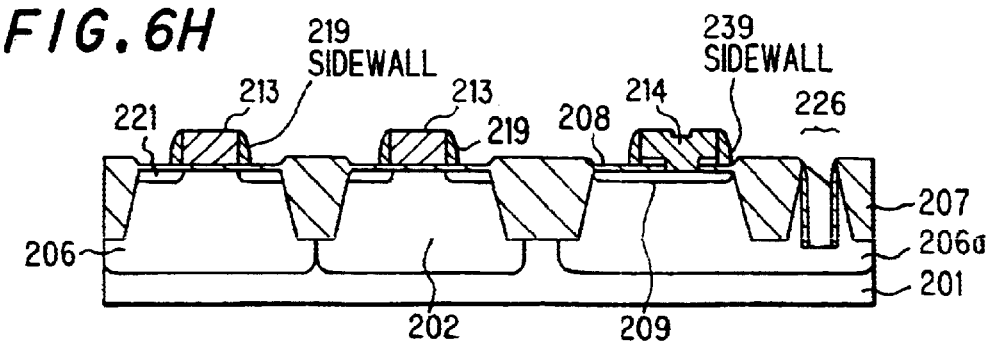

Then, after growing third oxide film, as shown in FIG. 6H, side walls 239 with one layer of the third oxide film or side walls with two layers of the second oxide film 237 and third oxide film are formed on the side of the gate electrode 213, emitter extraction electrode 214 and collector trench 224 by known anisotropic etching.

Figure 6I:
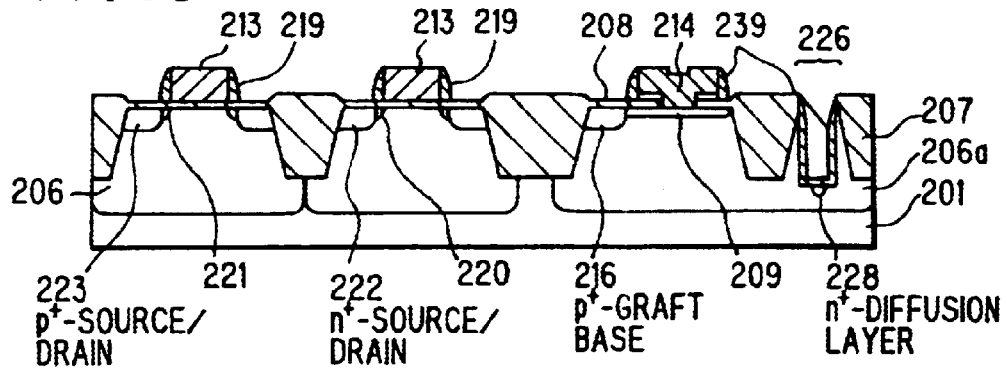

Then, as shown in FIG. 6I, a n+-type source/drain region 222 for n-MOS is formed by ion-implanting impurity of phosphorus, arsenic or the like. Also, a n+-type diffusion layer 228 is formed at the bottom of the collector trench 224. Then, a p+-type source/drain region 223 for p-MOS and a p+-type graft base 216 are formed by ion-implanting impurity of boron, BF$_2$ or the like.

Meanwhile, the impurity introduction into the emitter extraction electrode 214 when the second polysilicon film 242 (FIG. 6F) to form the emitter extraction electrode 214 is grown non-doping may be conducted simultaneously with the ion implantation of impurity of phosphorus, arsenic or the like to form the n+-type source/drain region 222 for n-MOS. Alternatively, it may be conducted by another step of implanting impurity of phosphorus, arsenic or the like.

Also, it is desired that these ion implantations be conducted through thin oxide film 241 of about 5 to 20 nm to be further formed on, e.g., the exposed surface of the p-type silicon substrate 201 so as to prevent a crystal defect at the end of the side wall 219.

Figure 6J:
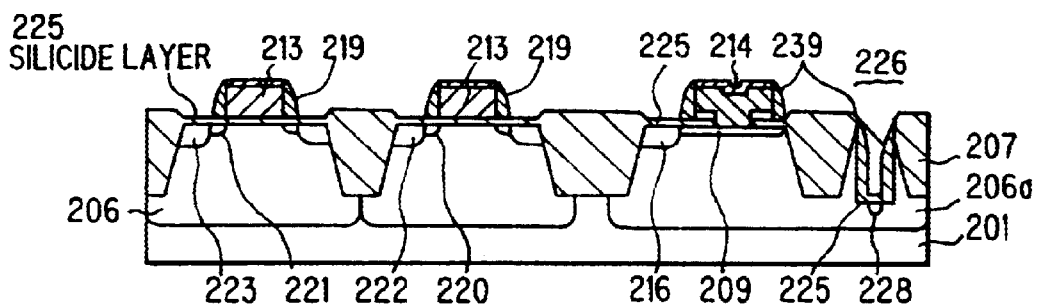

Then, as shown in FIG. 6J, a silicide layer 225 is formed by siliciding the surface of the gate electrode 213, emitter extraction electrode 214, n+-type diffusion layer 228 at the bottom of the collector trench 224, n+-type source/drain region 222, p+-type source/drain region 223 and p+-type graft base 216 by known method using metal of titanium, cobalt, nickel or the like.

Figure 6K:
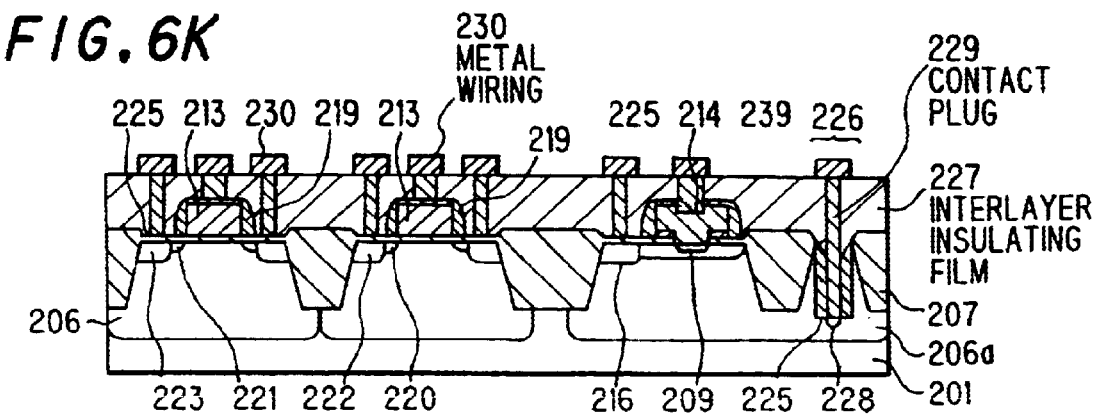

Then, as shown in FIG. 6K, interlayer insulating film 227 composed of, e.g., oxide film (TEOS-SiO$_2$ film) of 50 nm and BPSG (boron-phosphorus-silicate-glass) of 800 nm like the third prior art is formed. In addition, contacts are formed at predetermined positions of the interlayer insulating film 227, and then a contact plug 229 are formed through barrier metal (not shown). Then, metal wiring 230 to contact the contact plug 229 is formed on the interlayer insulating film 227. Though, in FIG. 6K, the contact width for the collector trench 224 is shown to be smaller than the width of the collector trench 224, it may be equal to or greater than that of the collector trench 224.

Next, referring to FIG. 6K, the structure of the bipolar transistor in the semiconductor device in the second embodiment will be explained below.

In the bipolar transistor, the collector region 206a is formed on the p-type silicon substrate 201. The collector contact 226 and the p-type base region 209 are separated from each other by the device-separating oxide film 207 formed on the surface of the collector region 206a. Also, in the region of the collector contact 226, the bottom of the collector trench (concave portion) 224 is formed to abut on a portion with peak impurity concentration in the collector region 206a.

Also, the side walls 219 are formed on the side of the collector trench 224. The n$^+$-type diffusion layer 228 to be formed in implanting the n$^+$-type source/drain 222 for CMOS is formed at part of the bottom of the collector trench 224 where the side wall 219 is not left. Also, the silicide layer 225 is formed on the surface of the n$^+$-type diffusion layer 228. It is connected through barrier metal (not shown) to the contact plug 229. The contact plug 229 is connected to the metal wiring 230 formed on the interlayer insulating film 227.

Meanwhile, the bottom of the collector trench 224 may be formed a little lower than the portion with peak impurity concentration in the collector region 206a so that a portion with peak impurity concentration in the n$^+$-type diffusion layer 228 can abut on the portion with peak impurity concentration in the collector region 206a.

As described above, in the second embodiment, the n$^+$-type buried layer and epitaxial layer are not formed and the collector region is formed by the ion implantation at high energy. As a result, the problem that the transistor size is prevented from being decreased because of the unnecessary expansion in impurity region due to thermal hysteresis can be solved.

Also, in the second embodiment, the collector resistance is not increased because the collector region 206a and the contact plug 229 connected to the metal wiring 230 are directly connected at the bottom of the collector trench 224.

Further, the collector trench 224 is formed by etching with using the photoresist pattern and device-separating oxide film 207 as a mask, subsequently after forming the emitter extraction electrode 214. Therefore, the number of fabrication steps is not increased. Namely, in the second embodiment, the essential problem that the number of fabrication steps of BiCMOS is too many can be solved by having some of the steps of fabricating CMOS and bipolar transistor in common.

As described above, in the first and second embodiments, an increase in the collector resistance can be suppressed by forming the trench at the collector contact.

Further, in the first and second embodiments, the collector resistance can be significantly reduced by designing the trench depth at the collector trench to abut on the portion with peak impurity concentration in the collector region. This is proved by the experimental result in FIG. 7 that the collector resistance is minimized at a position where the depth of collector trench reaches the portion with peak impurity concentration in the collector region.

Figure 7:
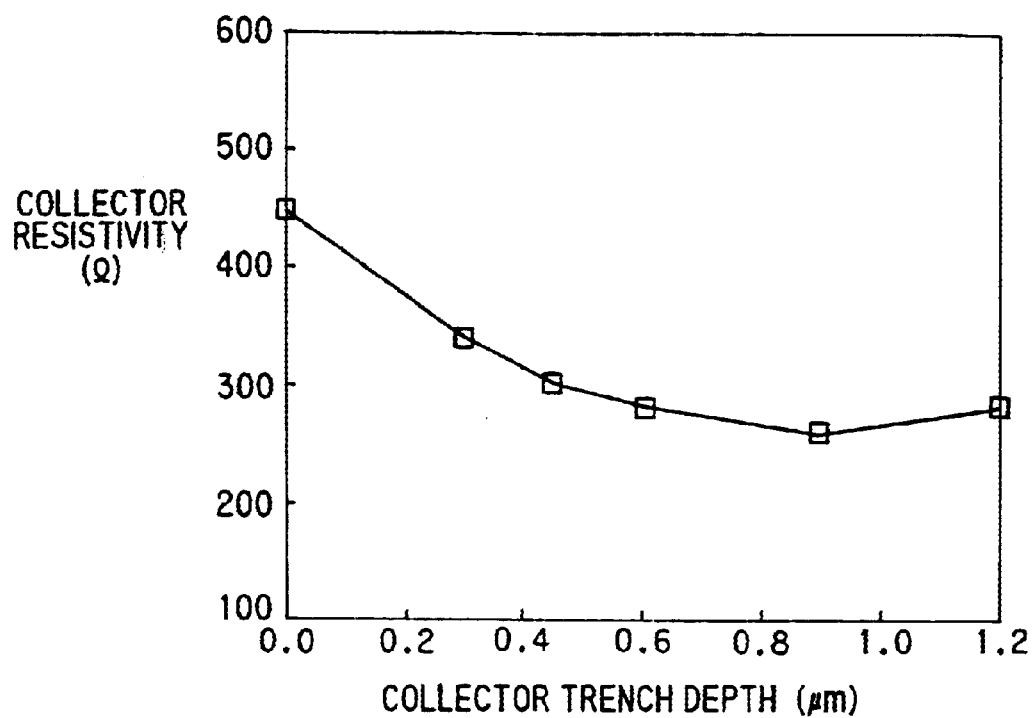
FIG. 7 is a graph showing measurements of collector resistance when a contact plug for collector extraction is connected only at the bottom of a collector trench.

FIG. 7 shows the measurements of collector resistance when the contact plug for collector extraction is connected only at the bottom of the collector trench according to the first and second embodiments. A bipolar transistor used in this experiment has a peak of impurity concentration at a depth of about 0.9 μm.

In the first and second embodiments, the collector resistance can be reduced to 250$\Omega$, compared with a collector resistance of 450$\Omega$ in case of no collector trench. When the collector resistance is 250$\Omega$, the base-to-emitter voltage of transistor characteristics can be improved from 1.1V to 1.2V, i.e., by about 20%, compared with the collector resistance of 300$\Omega$. Therefore, no deterioration in base current characteristic can be observed.

On the other hand, in the first and second embodiments, the n-type well region for p-MOS and the collector region for bipolar transistor are formed by the ion implantation conducted commonly as shown in FIGS. 5H and 6K, respectively. However, it is difficult to optimize simultaneously the conditions of these formations.

First, to suppress the short-channel effect of p-MOS transistor, it is desired that a region with a high n-type impurity concentration be formed at a position of about 0.2 μm deep equal to the junction depth of source/drain region. Further, forp-MOS, the junction depth of source/drain region will be reduced with the miniaturization.

For the bipolar transistor, it is desired that the collector-to-base or emitter-to-collector breakdown voltage be higher than the power-source voltage, the collector-to-base capacity be reduced as much as possible, and the collector resistance be reduced as much as possible. Thus, it is required that the impurity concentration around the surface of the p-type silicon substrate be lowered as much as possible and a region with a high n-type impurity concentration be formed at a position of about 0.6 to 1.0 μm deep.

As understood from these, when the transistor size is further reduced, it will be difficult to optimize simultaneously the conditions of these formations.

In this regard, a method for making a semiconductor device in the third embodiment will give a solution.

The method for making a semiconductor device in the third preferred embodiment will be explained below.

Figure 8A:
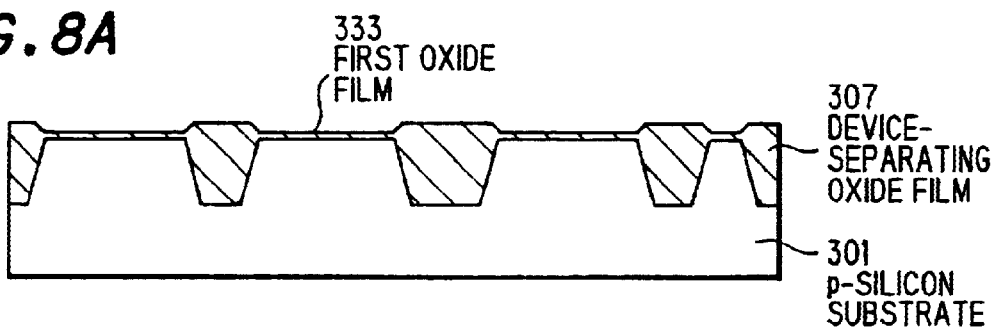

At first, as shown in FIG. 8A, device-separating oxide film 307 and first oxide film 333 are formed on a p-type silicon substrate 301 by using known LOCOS or STI etc.

Figure 8B:
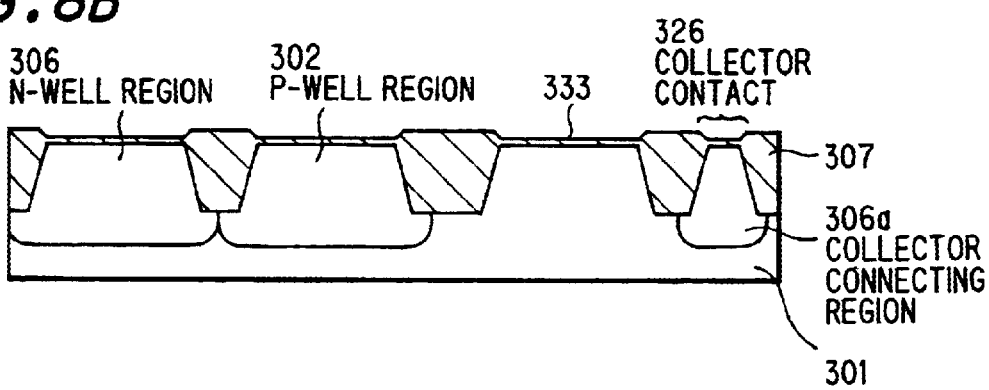

Then, as shown in FIG. 8B, a p-well region 302 to form n-MOS is formed by implanting, e.g., boron of $5\times10^{13}$ cm$^{-2}$ at 350 keV. Also, a n-well region 306 to form p-MOS and a collector connection region 306a to form the collector of the bipolar transistor are formed by implanting, e.g., phosphorus of $1\times10^{13}$ to $5\times10^{13}$ cm$^{-2}$ at high energy of 300 to 800 keV and further phosphorus of $1\times10^{12}$ to $1\times10^{13}$ cm$^{-2}$ at 50 to 150 keV.

Figure 8C:
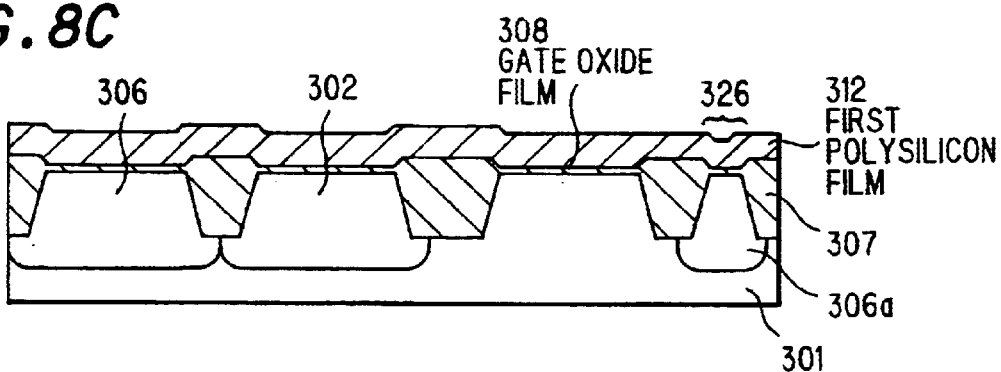

Then, as shown in FIG. 8C, gate oxide film 308 of 5 to 10 nm thick is formed on the p-type silicon substrate 301. Then, a collector region 311 for bipolar transistor is formed by implanting selectively phosphorus of $1\times10^{13}$ to $1\times10$ cm$^{-2}$ at high energy of 700 keV to 1.5 MeV with using a photoresist mask pattern. Further, a p-type base region 309 is formed by implanting, e.g., boron or BF2 of $1\times10^{13}$ to $5 \times 10^4$ cm$^{-2}$ at 10 to 50 keV with using the same photoresist mask pattern. Then, first polysilicon film 312 of 150 to 400 nm is grown thereon.

Meanwhile, in the third embodiment, the collector region 311 and the p-type base region 309 are formed after forming the gate oxide film 308. However, they may be formed before forming the gate oxide film 308.

Figure 8D:
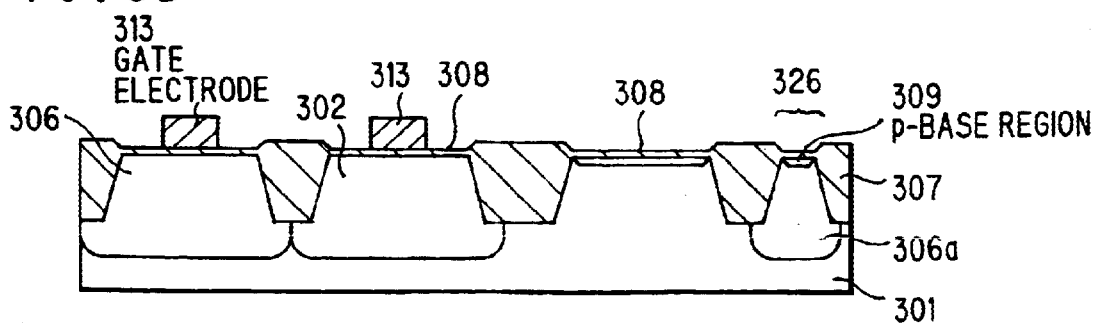

Then, as shown in FIG. 8D, gate electrodes 313 are formed by removing selectively the first polysilicon film 312 by known anisotropic etching with using a photoresist mask pattern, and then the photoresist pattern is removed.

Figure 8E:
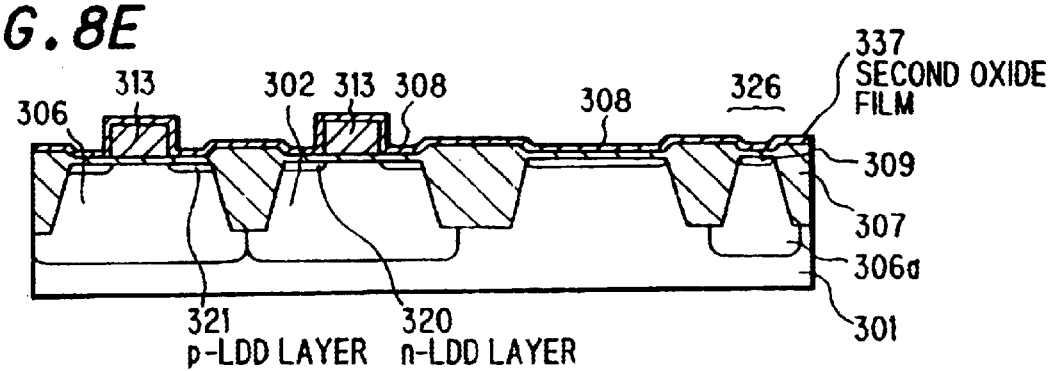

Then, as shown in FIG. 8E, a n-type LDD layer 320, a p-type LDD layer 321 are formed. Then, second oxide film 337 is grown.

Meanwhile, in the third embodiment, the collector region 311 and p-type base region 309 are formed at the step in FIG. 8C. However, they may be formed before growing the second oxide film 337.

Figure 8F:
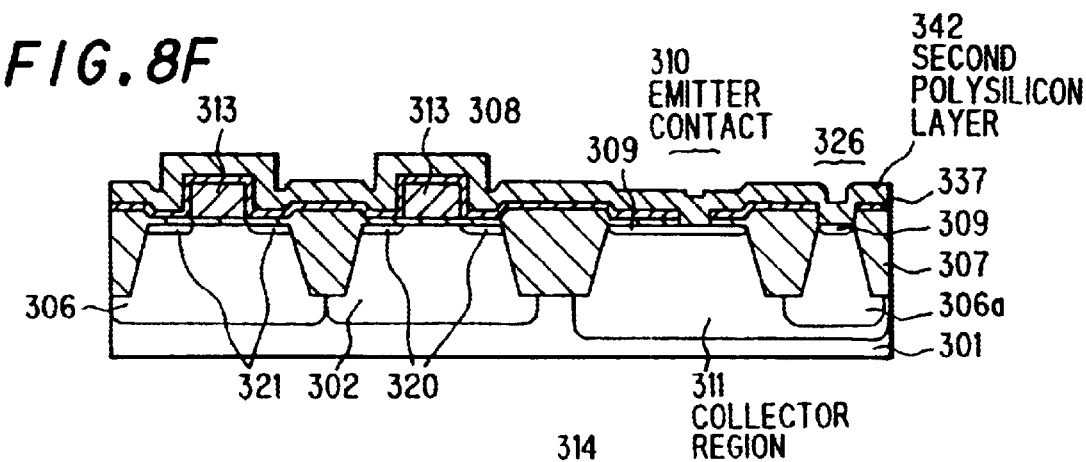

Then, as shown in FIG. 8F, an emitter contact 310 and a collector contact 326 are formed by etching selectively the second oxide film 337 with using a photoresist mask pattern. Then, second polysilicon film 342 of 150 to 400 nm is grown.

Meanwhile, the second polysilicon film 342 may be grown non-doping or doping with impurity of, e.g., phosphorus or arsenic, of $1 \times 10^{18}$ to $1 \times 10^{21}$ cm$^{-2}$.

Figure 8G:
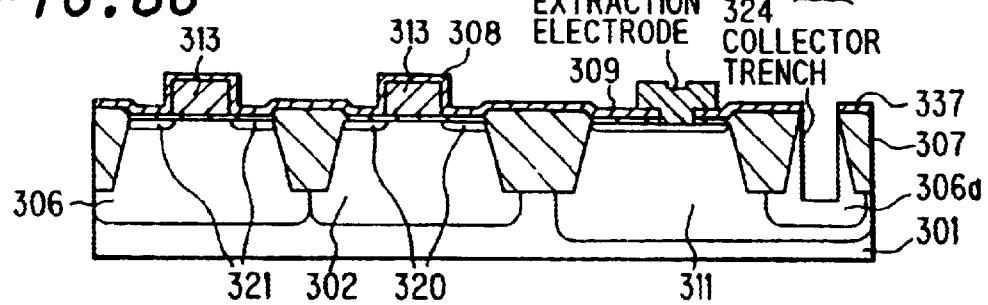

Then, as shown in FIG. 8G, an emitter extraction electrode 314 is formed by removing selectively the polysilicon film 342 by known anisotropic etching with using a photoresist mask pattern. Then, a collector trench 324 is formed by further etching with using the photoresist pattern and second oxide film 337 as a mask. Then, the photoresist pattern is removed. These etchings may be conducted sequentially on same conditions or separately in several steps.

Figure 8H:
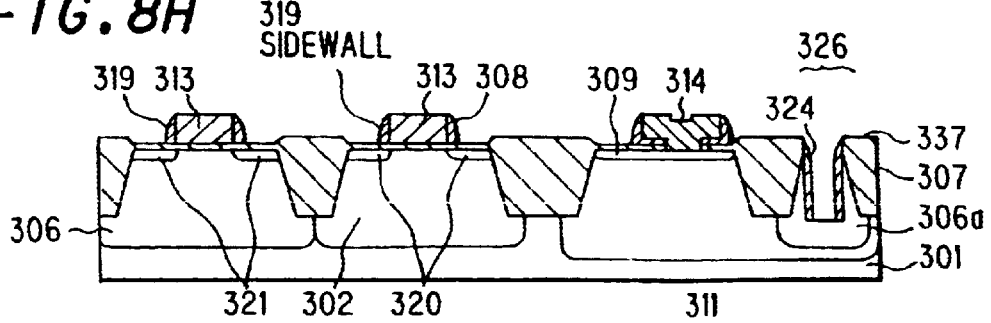

Then, after growing third oxide film 339, as shown in FIG. 8H, side walls 319 of the third oxide film are formed on the side of the gate electrode 313, emitter extraction electrode 314 and collector trench 324 by known anisotropic etching. Meanwhile, the side wall formed on the side of the gate electrode 313 is of two layers of the second oxide film 337 and third oxide film 339.

Then, as shown in FIG. 8I, a n$^+$-type source/drain region 322 for n-MOS is formed by ion-implanting impurity of phosphorus, arsenic or the like. Also, a n$^+$-type diffusion layer 328 is formed at the bottom of the collector trench 324. Then, a p$^+$-type source/drain region 323 for p-MOS and a p$^+$-type graft base 316 are formed by ion-implanting impurity of boron, BF$_2$ or the like.

Meanwhile, the impurity introduction into the emitter extraction electrode 314 when the second polysilicon film 342 to form the emitter extraction electrode 314 is grown non-doping may be conducted simultaneously with the ion implantation of impurity to form the n$^+$-type source/drain region 322 for n-MOS. Alternatively, it may be conducted by another step of implanting impurity of phosphorus, arsenic or the like.

Also, it is desired that these ion implantations be conducted through thin oxide film 341 of about 5 to 20 nm to be further formed on, e.g., the exposed surface of the p-type silicon substrate 301 so as to prevent a crystal defect at the end of the side wall 319.

Then, as shown in FIG. 8J, a silicide layer 325 is formed by siliciding the surface of the gate electrode 313, emitter extraction electrode 314, n$^+$-type diffusion layer 328 at the bottom of the collector trench 324, n$^+$-type source/drain region 322, p$^+$-type source/drain region 323 and p$^+$-type graft base 316 by known method using metal of titanium, cobalt, nickel or the like.

Then, as shown in FIG. 8K, interlayer insulating film 327 composed of, e.g., oxide film (TEOS-SiO$_2$ film) of 50 nm and BPSG (boron-phosphorus-silicate-glass) of 800 nm like the third prior art is formed. In addition, contacts are formed at predetermined positions of the interlayer insulating film 327, and then a contact plug 329 are formed through barrier metal (not shown). Then, metal wiring 330 to contact the contact plug 329 is formed on the interlayer insulating film 327. Though, in FIG. 8K, the contact width for the collector trench 324 is shown to be smaller than the width of the collector trench 324, it may be equal to or greater than that of the collector trench 324.

Next, referring to FIG. 8K, the structure of the bipolar transistor in the semiconductor device in the third embodiment will be explained below.

In the bipolar transistor, the collector region 311 is formed on the p-type silicon substrate 301 and the collector connection region 306a is formed only at the collector contact 326 in the collector region 311. The collector contact 326 and the p-type base region 309 are separated from each other by the device-separating oxide film 307 formed on the surface of the collector region 311. Also, in the region of the collector contact 326, the bottom of the collector trench 324 is formed to abut on a portion with peak impurity concentration in the collector region 311.

Also, the side walls 319 are formed on the side of the collector trench 324. The n$^+$-type diffusion layer 328 to be formed in implanting the n$^+$-type source/drain 322 for CMOS is formed at part of the bottom of the collector trench 324 where the side wall 319 is not left. Also, the silicide layer 325 is formed on the surface of the n$^+$-type diffusion layer 328. It is connected through barrier metal (not shown) to the contact plug 329. The contact plug 329 is connected to the metal wiring 330 formed on the interlayer insulating film 327.

Meanwhile, the bottom of the collector trench 324 may be formed a little lower than the portion with peak impurity concentration in the collector region 311 so that a portion with peak impurity concentration in the n$^+$-type diffusion layer 328 can abut on the portion with peak impurity concentration in the collect or region 311.

As described above, in the third embodiment, the n$^+$-type buried layer and epitaxial layer are not formed and the collector region is formed by the ion implantation at high energy. As a result, the problem that the transistor size is prevented from being decreased because of the unnecessary expansion in impurity region due to thermal hysteresis can be solved.

Also, the collector trench 324 is formed by etching with using the photoresist pattern and second oxide film 337 as a mask, subsequently after forming the emitter extraction electrode 314. Therefore, the number of fabrication steps is not increased. Namely, in the third embodiment, the essential problem that the number of fabrication steps of BiCMOS is too many can be solved by having some of the steps of fabricating CMOS and bipolar transistor in common.

Also, in the third embodiment, the collector resistance is not increased because the collector region 311 and the contact plug 329 connected to the metal wiring 330 are directly connected at the bottom of the collector trench 324.

Figure 4:
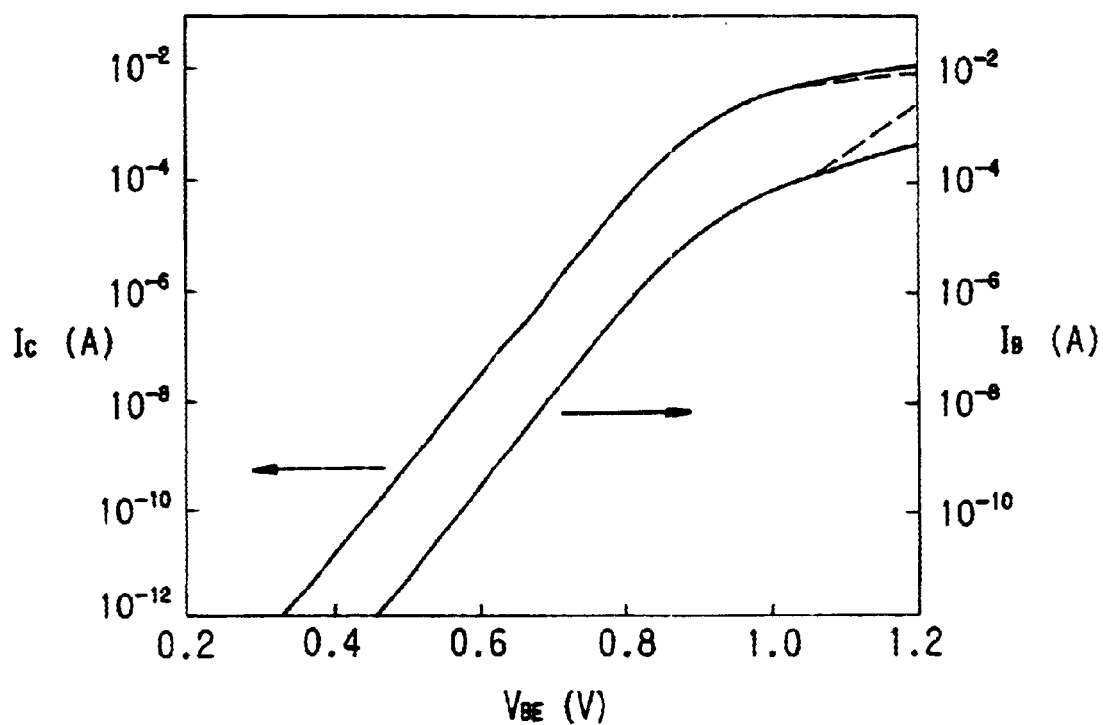
FIG. 4 is a graph showing DC-characteristics dependency to collector resistance in applying a voltage of 1.0V between the collector and emitter of an bipolar transistor.

In addition, in the third embodiment, the impurity concentration can be increased by forming the collector connection region 306a and collector region 311 at the collector contact 326. Thereby, the collector resistance can be further reduced to 200Ω. Meanwhile, when a collector resistance of 200Ω is given, the characteristic shown by the full lines in FIG. 4 can be obtained. In this case, no deterioration in base current characteristic can be observed.

In the first to third embodiments, as shown in FIGS. 5H, 6K and 8K, the silicide layer exists only at a part of the bottom of the collector trench because the side wall is formed on the sides of the collector trench. If the etching to form the contact hole is insufficiently conducted, then the following problems may occur.

The formation of contact hole before forming the contact plug is generally conducted deeper for the collector trench buried with the interlayer insulating film. However, when the contact hole is insufficiently formed, a remainder of interlayer insulating film 327a shown in FIG. 9A occurs.

Figure 9A:
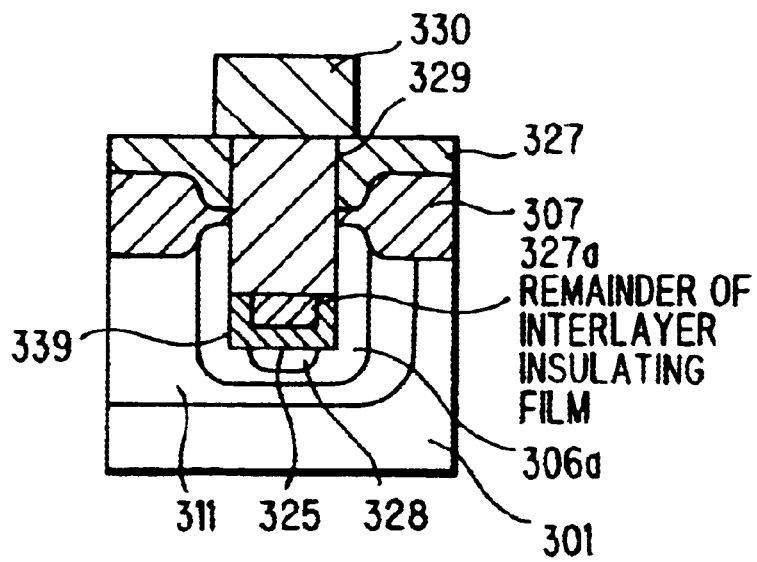
FIGS. 9A and 9B are partial cross sectional views illustrating problems in the third embodiment.
Figure 9B:
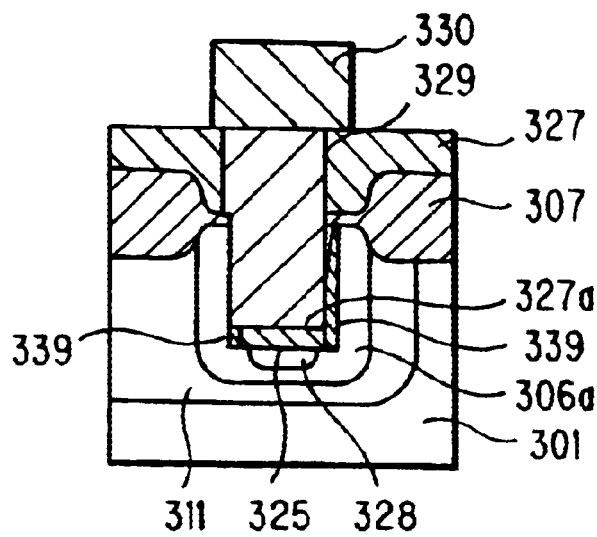

Also, when the positioning in forming the contact hole is inaccurately conducted as shown in FIG. 9B, the contact area at the bottom of the contact plug 329 may be varied. Thereby, the collector resistance may be increased or dispersed. Meanwhile, numerals used in FIGS. 9A and 9B are identical with those in FIGS. 8A to 8K.

In this regard, a method for making a semiconductor device in the fourth embodiment will give a solution.

The method for making a semiconductor device in the fourth preferred embodiment will be explained below.

Figure 10A:
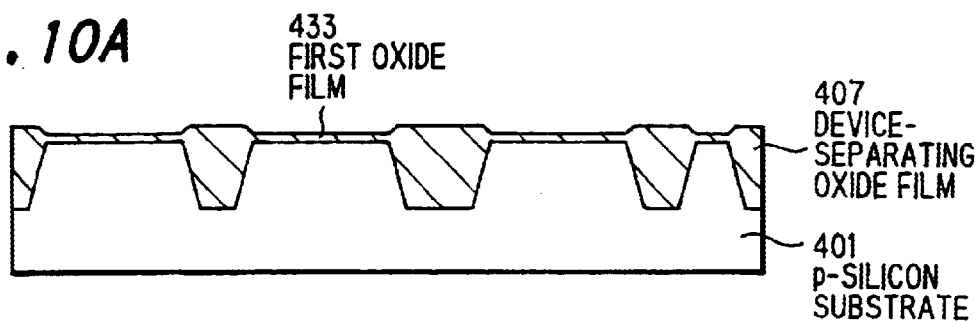
FIGS. 10A to 10K are cross sectional views showing the structure and fabrication method of a semiconductor device in a fourth preferred embodiment according to the invention.

At first, as shown in FIG. 10A, device-separating oxide film 407 and first oxide film 433 are formed on a p-type silicon substrate 401 by using known LOCOS or STI etc.

Figure 10B:
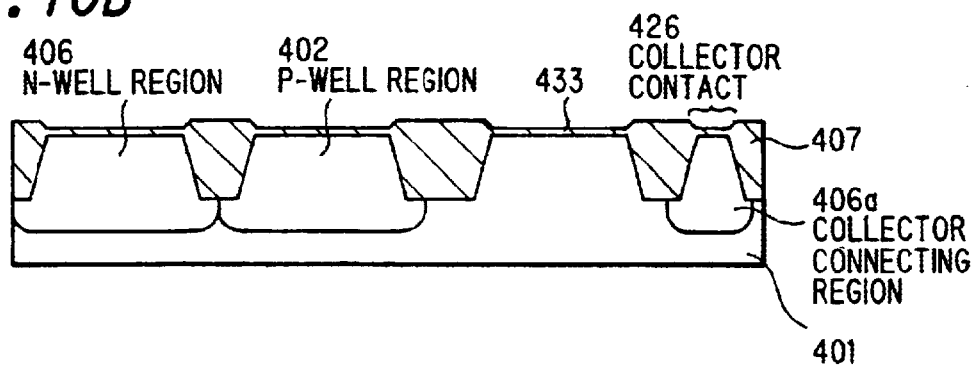

Then, as shown in FIG. 10B, a p-well region 402 to form n-MOS is formed by implanting, e.g., boron of $5\times10^{-}$cm$^{-2}$ at 350 keV. Also, a n-well region 406 to form p-MOS and a collector connection region 406a to form the collector of the bipolar transistor are formed by implanting, e.g., phosphorus of $1\times10^{13}$ to $5\times10^{13}$ cm$^{-2}$ at high energy of 300 to 800 keV and further phosphorus of $1\times10^{12}$ to $1\times10^{13}$ cm$^{-2}$ at 50 to 150 keV.

Figure 10C:
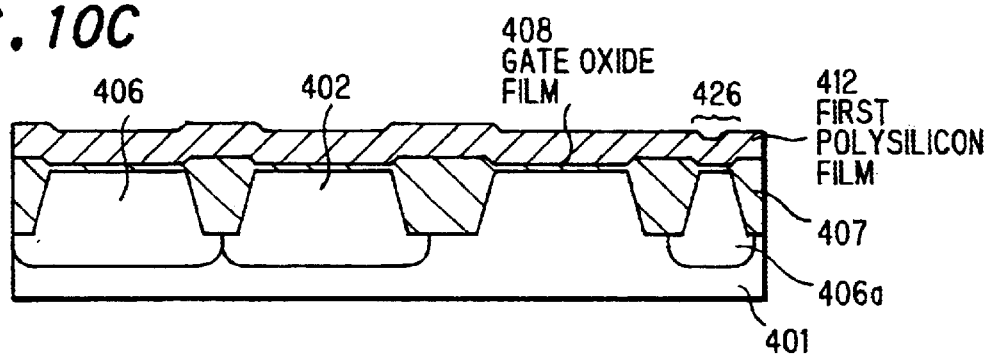

Then, as shown in FIG. 10C, gate oxide film 408 of 5 to 10 nm thick is formed on the p-type silicon substrate 401. Then, a collector region 411 for bipolar transistor is formed by implanting selectively phosphorus of $1\times10^{13}$ to $1\times10^{14}$ cm$^{-2}$ at high energy of 700 keV to 1.5 MeV with using a photoresist mask pattern. Further, a p-type base region 409 is formed by implanting, e.g., boron or BF2 of $1\times10^{13}$ to $5\times10^{14}$ cm$^{-2}$ at 10 to 50 keV with using the same photoresist mask pattern. Then, after removing the photoresist pattern, first polysilicon film 412 of 150 to 400 nm is grown thereon.

Meanwhile, in the fourth embodiment, the collector region 411 and the p-type base region 409 are formed after forming the gate oxide film 408. However, they may be formed before forming the gate oxide film 408.

Figure 10D:
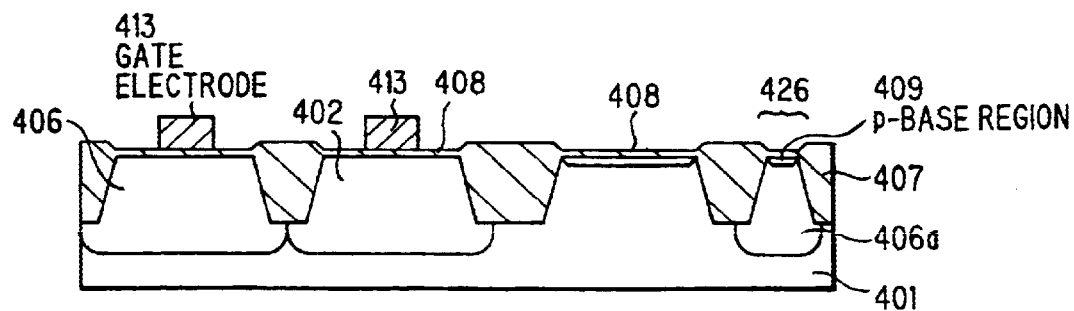

Then, as shown in FIG. 10D, gate electrodes 413 are formed by removing selectively the first polysilicon film 412 by known anisotropic etching with using a photoresist mask pattern, and then the photoresist pattern is removed.

Figure 10E:
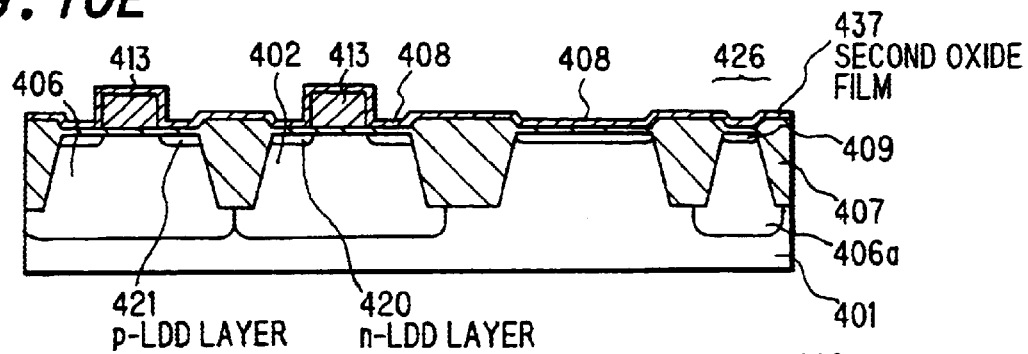

Then, as shown in FIG. 10E, a n-type LDD layer 420, a p-type LDD layer 421 are formed. Then, second oxide film 437 is grown.

Meanwhile, in the fourth embodiment, the collector region 411 and p-type base region 409 are formed at the step in FIG. 10C. However, they may be formed before growing the second oxide film 437.

Figure 10F:
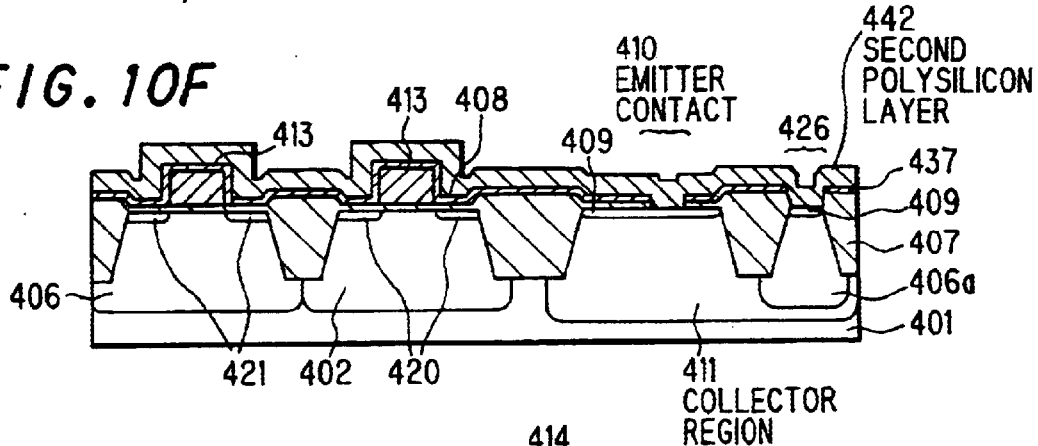

Then, as shown in FIG. 10F, an emitter contact 410 and a collector contact 426 are formed by etching selectively the second oxide film 437 with using a photoresist mask pattern. Then, second polysilicon film 442 of 150 to 400 nm is grown thereon.

Meanwhile, the second polysilicon film 442 may be grown non-doping or doping with impurity of, e.g., phosphorus or arsenic, of $1\times10^{18}$ to $1\times10^{21}$ cm$^{-2}$.

Figure 10G:
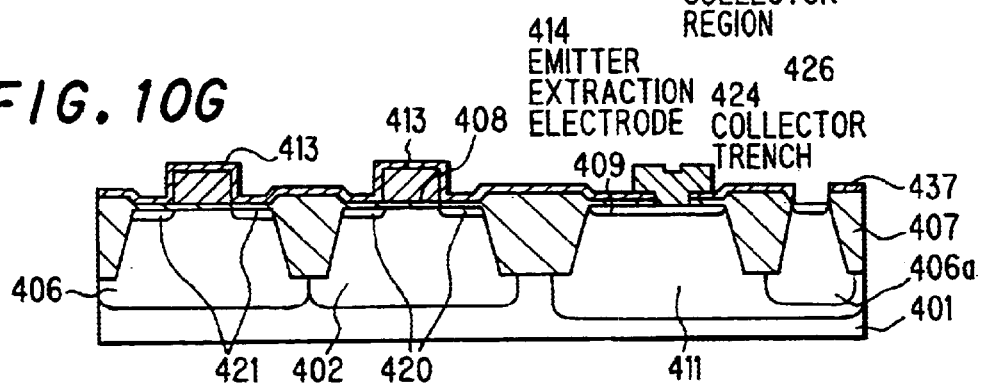

Then, as shown in FIG. 10G, an emitter extraction electrode 414 is formed by removing selectively the second polysilicon film 442 by known anisotropic etching with using a photoresist mask pattern. Then, a collector trench 424 is formed by further etching with using the photoresist pattern and second oxide film 437 as a mask. Then, the photoresist pattern is removed. These etchings may be conducted sequentially on same conditions or separately in several steps.

Figure 10H:
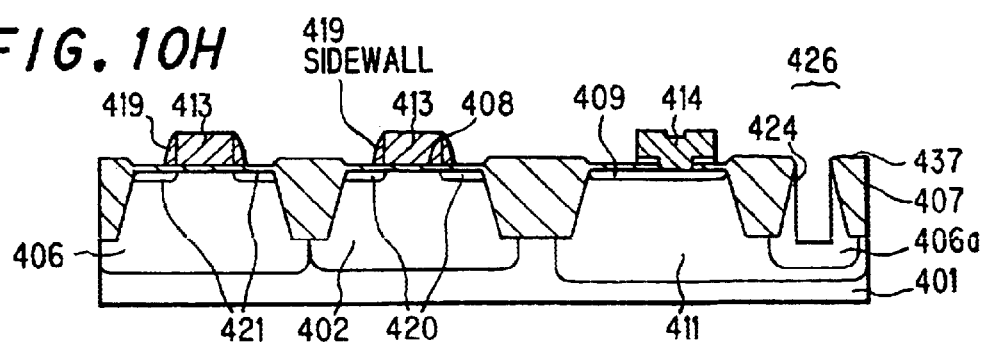

Then, as shown in FIG. 10H, side walls 419 composed of third oxide film 339 are formed on the side of the gate electrode 413 by known anisotropic etching. Meanwhile, as seen from FIG. 10H, the third oxide film 439 is removed from the base region while remaining a part thereof under the emitter extraction electrode 414.

Figure 10I:
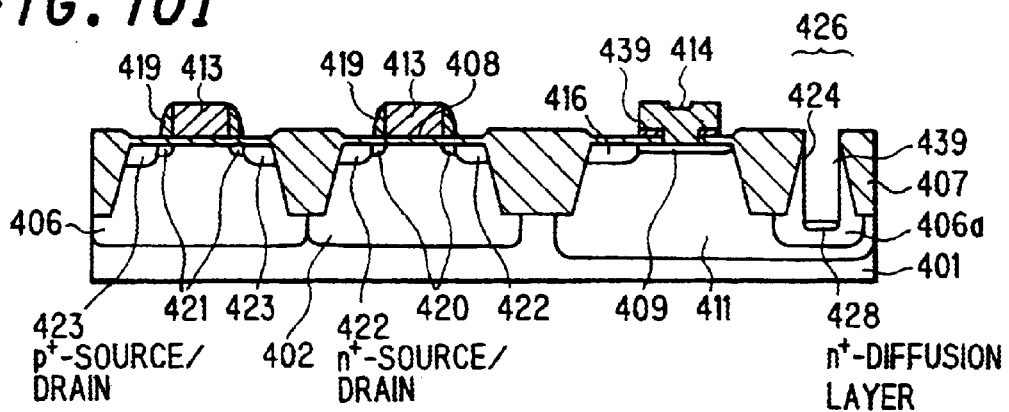

Then, as shown in FIG. 10I, a n$^+$-type source/drain region 422 for n-MOS is formed by ion-implanting impurity of phosphorus, arsenic or the like. Also, a n$^+$-type diffusion layer 428 is formed at the bottom of the collector trench 424. Then, a p$^+$-type source/drain region 423 for p-MOS and a p$^+$-type graft base 416 are formed by ion-implanting impurity of boron, BF$_2$ or the like.

Meanwhile, these ion implantations maybe, as described earlier, conducted through thin oxide film of about 5 to 20 nm so as to prevent a crystal defect at the end of the side wall 419 or conducted with remaining the third oxide film 439 of about 5 to 10 nm when the third oxide film 439 is anisotropic-etched to form the side wall. In the fourth embodiment, the latter method is employed.

Meanwhile, the impurity introduction into the emitter extraction electrode 414 when the second polysilicon film 442 to form the emitter extraction electrode 414 is grown non-doping may be conducted simultaneously with the ion implantation of impurity to form the n$^+$-type source/drain region 422 for n-MOS. Alternatively, it may be conducted by another step of implanting impurity of phosphorus, arsenic or the like.

Figure 10J:
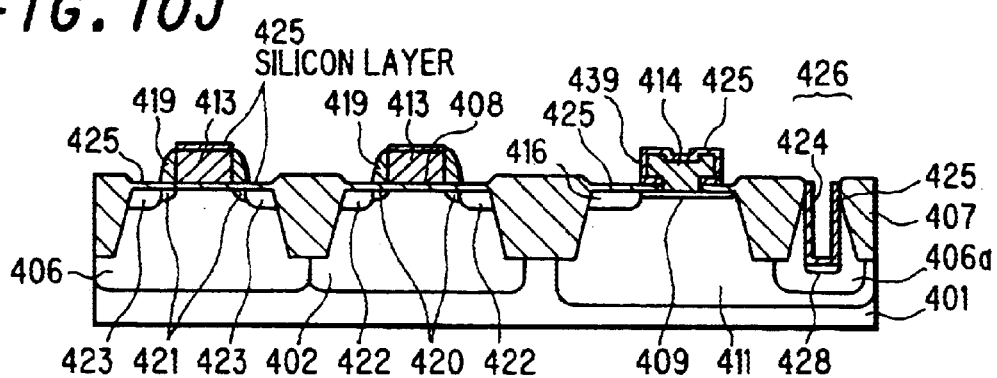

Then, as shown in FIG. 10J, a silicide layer 425 is formed by siliciding the surface of the gate electrode 413, emitter extraction electrode 414, the bottom and sides of the collector trench 424, n$^+$-type source/drain region 422, p$^+$-type source/drain region 423 and p$^+$-type graft base 416 by known method using metal of titanium, cobalt, nickel or the like.

Figure 10K:
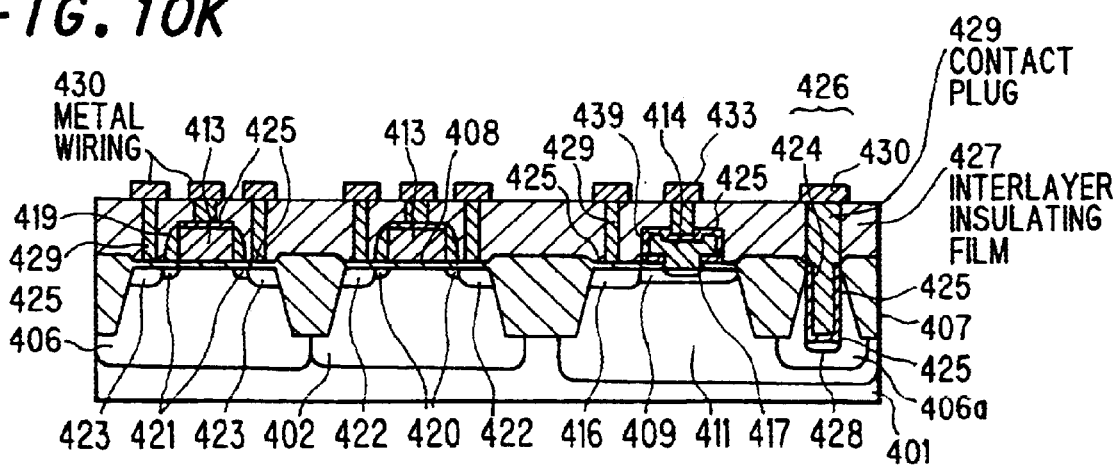

Then, as shown in FIG. 10K, interlayer insulating film 427 composed of, e.g., oxide film (TEOS-SiO$_2$ film) of 50 nm and BPSG (boron-phosphorus-silicate-glass) of 800 nm like the third prior art is formed. In addition, contacts are formed at predetermined positions of the interlayer insulating film 427, and then a contact plug 429 are formed through barrier metal (not shown). Then, metal wiring 430 to contact the contact plug 429 is formed on the interlayer insulating film 427.

Next, referring to FIG. 10K, the structure of the bipolar transistor in the semiconductor device in the fourth embodiment will be explained below.

In the bipolar transistor, the collector region 411 is formed on the p-type silicon substrate 401 and the collector connection region 406a is formed only at the collector contact 426 in the collector region 411. The collector contact 426 and the p-type base region 409 are separated from each other by the device-separating oxide film 407 formed on the surface of the collector region 411. Also, in the region of the collector contact 426, the bottom of the collector trench 424 is formed to abut on a portion with peak impurity concentration in the collector region 411.

Also, the impurity region to be formed in implanting the n+-type source/drain for CMOS is formed at the bottom of the collector trench 424. Also, the silicide layer 425 is formed on the sides and bottom surface of the collector trench 424. It is connected through barrier metal (not shown) to the contact plug 429. The contact plug 429 is connected to the metal wiring 430 formed on the interlayer insulating film 427.

Meanwhile, the bottom of the collector trench 424 may be formed a little lower than the portion with peak impurity concentration in the collector region 411 so that a portion with peak impurity concentration in the n+-type diffusion layer 428 can abut on the portion with peak impurity concentration in the collector region 411.

As described above, in the fourth embodiment, the n+-type buried layer and epitaxial layer are not formed and the collector region is formed by the ion implantation at high energy. As a result, the problem that the transistor size is prevented from being decreased because of the unnecessary expansion in impurity region due to thermal hysteresis can be solved.

Also, in the fourth embodiment, the collector resistance is not increased because the collector region 411 and the contact plug 429 connected to the metal wiring 430 are directly connected at the bottom of the collector trench 424.

Also, the collector trench 424 is formed by etching with using the photoresist pattern and device-separating oxide film 407 as a mask, subsequently after forming the gate electrode 413 and emitter extraction electrode 414. Therefore, the number of fabrication steps is not increased. Namely, in the fourth embodiment, the essential problem that the number of fabrication steps of BiCMOS is too many can be solved by having some of the steps of fabricating CMOS and bipolar transistor in common.

Furthermore, in the fourth embodiment, as seen from FIGS. 10J and 10K, the side wall 419 is not formed on the sides of the collector trench 424. Therefore, the silicide layer can be formed on the entire bottom surface and side of the collector trench 424, thereby reducing the collector resistance.

Moreover, in the fourth embodiment, the problems illustrated in FIGS. 9A and 9B can be solved.

Namely, an increase or dispersion in collector resistance can be suppressed because the silicide layer formed on the entire bottom surface and side of the collector trench 424 has a very low layer resistance of about $2^{\Omega}/\square$, even when the contact plug 329 does not reach the bottom of the collector trench 324 due to the remainder 327a of interlayer insulating film to be left in forming the contact hole as shown in FIG. 9A or the contact plug 329 contacts the side of the collector trench due to the inaccurate positioning of the contact hole as shown in FIG. 9B.

Figure 11A:
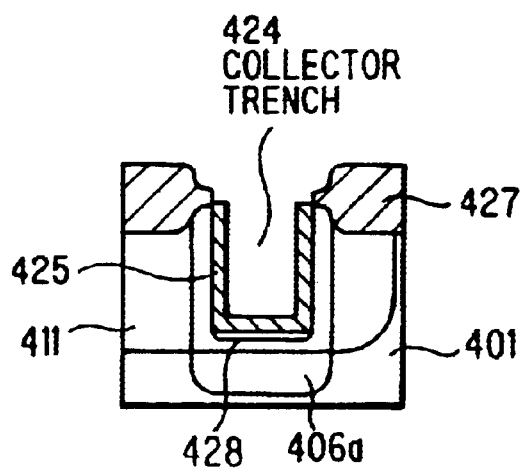
FIGS. 11A to 11C are partial cross sectional views showing alterations in the fourth embodiment.
Figure 11B:
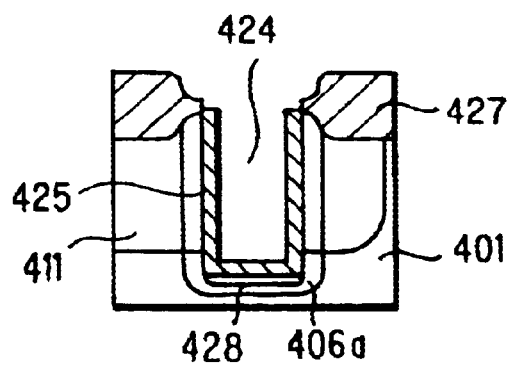
Figure 11C:
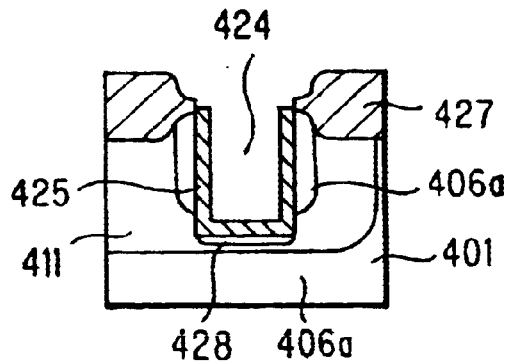

Next, alterations in the fourth embodiment will be explained in FIGS. 11A to 11C. FIGS. 11A to 11C shows enlarged parts, particularly around the collector trench 424, corresponding to those in FIG. 10J in the fourth embodiment. Numerals used in FIGS. 11A to 11C are identical with those in FIGS. 10A to 10K.

FIG. 11A shows the alteration that the collector connection region 406a is formed deeper than the collector region 411.

FIG. 11B shows the alteration that the collector connection region 406a is formed deeper than the collector region 411 and further the collector trench 424 is also formed deeper than the collector region 411.

FIG. 11C shows the alteration that the collector connection region 406a is formed shallower than the collector region 411 and further the collector trench 424 is formed deeper than the collector region 406a.

Meanwhile, by the alterations in FIGS. 11A to 11C, it will be easily understood that the collector trench 424 can be so disposed that the bottom of the collector trench 424 can contact directly or indirectly through the n+-type diffusion layer 428 the impurity peak of the collector connection region 406a or collector region 411.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a semiconductor device, comprising:

forming a collector extraction region that is separated by an insulating layer in a semiconductor substrate of a first conductivity type;

forming a collector region with an impurity of a second conductivity type into a region including said collector extraction region;

forming a base region with an impurity of a first conductivity type into a predetermined portion in said collector region;

forming an emitter region with an impurity of a second conductivity type into a predetermined portion in said base region;

forming a concave portion in said collector region up to a depth where said collector region has a peak concentration in impurity distribution by selectively removing said collector extraction region using said insulating layer as a mask; and forming a collector extraction electrode that is ohmic-connected with the bottom and the entire side of said concave portion.

2. A method for making a semiconductor device, comprising:

forming a collector extraction region that is separated by an insulating layer in a semiconductor substrate of a first conductivity type;

forming a collector region with an impurity of a second conductivity type into a region including said collector extraction region;

forming a collector connection region with an impurity of a second conductivity type with a concentration higher than said collector region into said collector extraction region;

forming a base region with an impurity of a first conductivity type into a predetermined portion in said collector region;

forming an emitter region with an impurity of a second conductivity type into a predetermined portion in said base region;

forming a concave portion in said collector connection region up to a depth where said collector region or collector connection region has a peak concentration in impurity distribution by selectively removing said collector extraction region using said insulating layer as a mask; and forming a collector extraction electrode that is ohmic-connected with the bottom and the entire side of said concave portion.

3. A method for making a semiconductor device, comprising:

forming a collector extraction region that is separated by an insulating layer in a semiconductor substrate of a first conductivity type;

forming a collector region with an impurity of a second conductivity type into a region including said collector extraction region;

forming a base region with an impurity of a first conductivity type into a predetermined portion in said collector region;

forming an emitter region with an impurity of a second conductivity type into a predetermined portion in said base region;

forming a concave portion in said collector region with a depth shallower than that where said collector region has a peak concentration in impurity distribution by selectively removing said collector extraction region using said insulating layer as a mask;

forming a diffusion layer from the bottom of said concave portion up to said depth where said collector region has said peak concentration in impurity distribution by implanting impurity of second conductivity type; and forming a collector extraction electrode that is ohmic-connected with the bottom and the entire side of said concave portion.

4. A method for making a semiconductor device, comprising:

forming a collector extraction region that is separated by an insulating layer in a semiconductor substrate of a first conductivity type;

forming a collector region with an impurity of a second conductivity type into a region including said collector extraction region;

forming a collector connection region with an impurity of a second conductivity type with a concentration higher than said collector region into said collector extraction region;

forming a base region with an impurity of a first conductivity type into a predetermined portion in said collector region;

forming an emitter region with an impurity of a second conductivity type into a predetermined portion in said base region;

forming a concave portion in said collector connection region with a depth shallower than that where said collector region or collector extraction region has a peak concentration in impurity distribution by selectively removing said collector extraction region using said insulating layer as a mask;

forming a diffusion layer from the bottom of said concave portion up to said depth where said collector region or collector extraction region has said peak concentration in impurity distribution by implanting impurity of second conductivity type; and forming a collector extraction electrode that is ohmic-connected with the bottom and the entire side of said concave portion.

5. A method for making a semiconductor device, according to claim 1, further comprising the steps of:

forming a first well by implanting impurity of second conductivity type into said semiconductor substrate simultaneously with the step of forming said collector region;

forming a second well by implanting impurity of first conductivity type into said semiconductor substrate;

forming a first MOS transistor in said first well region; and forming a second MOS transistor with a channel conductivity type different from that of said first MOS transistor in said second well region.

6. A method for making a semiconductor device, according to claim 2, further comprising the steps of:

forming a first well by implanting impurity of second conductivity type into said semiconductor substrate simultaneously with the step of forming said collector region;

forming a second well by implanting impurity of first conductivity type into said semiconductor substrate;

forming a first MOS transistor in said first well region; and forming a second MOS transistor with a channel conductivity type different from that of said first MOS transistor in said second well region.

7. A method for making a semiconductor device, according to claim 3, further comprising the steps of:

forming a first well by implanting impurity of second conductivity type into said semiconductor substrate simultaneously with the step of forming said collector region;

forming a second well by implanting impurity of first conductivity type into said semiconductor substrate;

forming a first MOS transistor in said first well region; and forming a second MOS transistor with a channel conductivity type different from that of said first MOS transistor in said second well region.

8. A method for making a semiconductor device, according to claim 4, further comprising the steps of:

forming a first well by implanting impurity of second conductivity type into said semiconductor substrate simultaneously with the step of forming said collector region;

forming a second well by implanting impurity of first conductivity type into said semiconductor substrate;

forming a first MOS transistor in said first well region; and forming a second MOS transistor with a channel conductivity type different from that of said first MOS transistor in said second well region.

* * * * *